(12) United States Patent
Kim et al.

(10) Patent No.: US 12,507,536 B2
(45) Date of Patent: Dec. 23, 2025

(54) DISPLAY APPARATUS

(71) Applicant: Samsung Display Co., Ltd., Yongin-si (KR)

(72) Inventors: Bohwa Kim, Yongin-si (KR); Younggil Park, Yongin-si (KR); Minuk Kim, Yongin-si (KR); Sungwook Woo, Yongin-si (KR); Nari Ahn, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 64 days.

(21) Appl. No.: 17/323,631

(22) Filed: May 18, 2021

(65) Prior Publication Data
US 2022/0045148 A1 Feb. 10, 2022

(30) Foreign Application Priority Data
Aug. 10, 2020 (KR) .......................... 10-2020-0099939

(51) Int. Cl.
*H10K 59/124* (2023.01)

(52) U.S. Cl.
CPC ................................. *H10K 59/124* (2023.02)

(58) Field of Classification Search
CPC .......... H01L 27/1225; H01L 29/41733; H10K 59/123; H10K 59/124; H10K 59/1213
See application file for complete search history.

(56) References Cited

U.S. PATENT DOCUMENTS 5,327,012 A * 7/1994 Yano ................... H01L 23/5226
257/E23.145
6,455,875 B2 * 9/2002 Takemura .......... H10D 30/6757
257/E29.147
(Continued)

FOREIGN PATENT DOCUMENTS

CN 103477441 A 12/2013
CN 103681690 A 3/2014
(Continued)

OTHER PUBLICATIONS

Chen-Fei Wu et al. "Contact Resistance Asymmetry of Amorphous Indium-Gallium-Zinc-Oxide Thin-Film Transistors by Scanning Kelvin Probe Microscopy", Chin. Phys. B, Mar. 31, 2016, pp. 057306-1-057306-5, vol. 25, No. 5.
(Continued)

*Primary Examiner* — Vongsavanh Sengdara
(74) *Attorney, Agent, or Firm* — Innovation Counsel LLP

(57) ABSTRACT

A display apparatus including a circuit with improved characteristics and including a thin-film transistor includes a first interlayer insulating layer arranged on a substrate, a first semiconductor layer arranged on the first interlayer insulating layer and including an oxide semiconductor material, a first gate electrode arranged on the first semiconductor layer, a second interlayer insulating layer arranged on the first gate electrode, and a first electrode layer arranged on the second interlayer insulating layer and electrically connected to the first semiconductor layer through a first contact hole penetrating the second interlayer insulating layer, wherein the first semiconductor layer includes an opening corresponding to the first contact hole, and the first electrode layer contacts an inner surface of the opening.

22 Claims, 18 Drawing Sheets

(56) References Cited

U.S. PATENT DOCUMENTS

| | | | |
|---|---|---|---|
| 7,262,469 B2 | 8/2007 | Makita | |
| 7,348,628 B2 | 3/2008 | Yoon et al. | |
| 9,190,526 B2 | 11/2015 | Moriguchi et al. | |
| 9,831,349 B2 | 11/2017 | Ishikawa et al. | |
| 11,011,594 B2 | 5/2021 | Kim et al. | |
| 2014/0034947 A1* | 2/2014 | Moriguchi | G02F 1/1368 |
| | | | 257/43 |
| 2014/0061632 A1 | 3/2014 | Lee et al. | |
| 2014/0326992 A1* | 11/2014 | Hondo | H10D 30/6757 |
| | | | 257/43 |
| 2015/0187823 A1* | 7/2015 | Miyairi | H10D 86/423 |
| | | | 257/43 |
| 2015/0380560 A1* | 12/2015 | Ishikawa | H10K 59/126 |
| | | | 257/43 |
| 2019/0341502 A1 | 11/2019 | Sato et al. | |

FOREIGN PATENT DOCUMENTS

| | | |
|---|---|---|
| CN | 110323230 A | 10/2019 |
| JP | 6417125 | 10/2018 |
| KR | 10-0522097 | 10/2005 |
| KR | 10-0734266 | 7/2007 |
| KR | 10-2014-0063444 | 5/2014 |
| KR | 10-1597886 | 2/2016 |
| KR | 10-2016-0066633 | 6/2016 |
| KR | 1020200061797 A | 6/2020 |
| WO | 2011043206 A1 | 4/2011 |

OTHER PUBLICATIONS

Office Action issued in Chinese patent application No. 202110907662.7 dated Jun. 24, 2025, 6 pages.

* cited by examiner

DISPLAY APPARATUS

CROSS-REFERENCE TO RELATED APPLICATION(S)

This application claims priority to and benefits of Korean Patent Application No. 10-2020-0099939 under 35 U.S.C. § 119, filed on Aug. 10, 2020 in the Korean Intellectual Property Office, the entire contents of which is incorporated herein by reference.

BACKGROUND

1. Technical Field

One or more embodiments relate to a display apparatus including a circuit with improved characteristics and including a thin-film transistor.

2. Description of the Related Art

With the rapid development in the field of display technology, various display devices having excellent characteristics have been introduced. Such characteristics include reduced thickness, lighter weight, and low power consumption. Among display apparatuses, in particular, organic light-emitting display apparatuses are drawing attention as a next generation display apparatus not only due to a wide viewing angle and superior contrast, but also due to fast response speed.

Such a display apparatus may include, as a driving circuit, a thin-film transistor (TFT), a capacitor, etc. The thin-film transistor may include an active layer including a channel area, a source area, and a drain area, and a gate electrode electrically insulated from the active layer by a gate insulating layer. In general, the active layer of the thin-film transistor may include amorphous silicon or polysilicon.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

In case that an active layer of a thin-film transistor includes amorphous silicon, it may be difficult to implement a driving circuit that operates at a high speed, due to low mobility of electric charges. Also, in case that the active layer includes polysilicon, the mobility of electric charges may be improved, but there may be a problem in that a separate compensation circuit needs to be added because a threshold voltage (Vth) of the thin-film transistor may not be uniform.

One or more embodiments may provide a display apparatus including a circuit with improved characteristics and including a thin-film transistor. However, it should be understood that embodiments described herein should be considered in a descriptive sense only and not for limitation of the embodiments.

Additional aspects will be set forth in the description which follows and, in part, will be apparent from the description, or may be learned by practice of the presented embodiments.

According to one or more embodiments, a display apparatus may include a first interlayer insulating layer arranged on a substrate, a first semiconductor layer arranged on the first interlayer insulating layer and including an oxide semiconductor material, a first gate electrode arranged on the first semiconductor layer, a second interlayer insulating layer arranged on the first gate electrode, and a first electrode layer arranged on the second interlayer insulating layer and electrically connected to the first semiconductor layer through a first contact hole penetrating the second interlayer insulating layer, wherein the first semiconductor layer may include an opening corresponding to the first contact hole, and the first electrode layer may contact an inner surface of the opening.

An angle between an upper surface of the substrate and the inner surface of the opening may be about 30° or greater.

The oxide semiconductor material may be an amorphous oxide semiconductor material.

The first electrode layer may contact at least a portion of the first interlayer insulating layer, the portion being exposed through the opening.

The first interlayer insulating layer may include a groove corresponding to the opening.

A slope of an inner surface of the first contact hole and a slope of an inner surface of the groove may be steeper than a slope of the inner surface of the opening.

A slope of an inner surface of the first contact hole may be steeper than a slope of the inner surface of the opening.

The inner surface of the opening may include at least two surfaces having different angles.

The inner surface of the opening may include a first surface and a second surface having different angles, the first surface may have a surface area greater than a surface area of the second surface, and an angle between the first surface and an upper surface of the substrate may be about 30° or greater.

A metal oxide layer may be disposed on at least a portion between the second surface of the inner surface of the opening and the first electrode layer.

The first semiconductor layer may include a portion that contacts the metal oxide layer, and the portion of the first semiconductor layer may include an upper layer portion including a crystalline metal oxide, and a lower layer portion including an amorphous oxide semiconductor material.

The first electrode layer may include a first metal layer and a third metal layer which include a same material, and a second metal layer between the first metal layer and the third metal layer, the second metal layer including a different material from a material of the first metal layer and a material of the third metal layer, wherein a thickness of the first metal layer and a thickness of the third metal layer may be less than a thickness of the second metal layer, and a thickness of metal oxide layer may be less than the thicknesses of the first metal layer and the thickness of the third metal layer.

The first surface may be extended to an inner surface of the first contact hole, and an angle formed by the second surface may be less than an angle formed by the first surface.

An angle between the second surface and the upper surface of the substrate may be about 30° or less.

The display apparatus may include a valley portion disposed at an edge portion of the first interlayer insulating layer, wherein the valley portion may be recessed in a direction of the substrate, and the edge portion of the first interlayer insulating layer may be exposed by the opening.

A slope of an inner surface of the valley portion extending from the inner surface of the opening may be steeper than a slope of the inner surface of the opening.

The first electrode layer may include a first metal layer and a second metal layer which include a same material, and a third metal layer between the first metal layer and the second metal layer, the third metal layer including a different material from a material of the first metal layer and a material of the second metal layer, and the first metal layer may be arranged along an inner surface of the valley portion.

At least a portion of the second metal layer may be disposed in the valley portion.

The display apparatus may further include a second semiconductor layer arranged on the first interlayer insulating layer and including an oxide semiconductor material, a second gate electrode arranged on the second semiconductor layer, and a second electrode layer arranged on the second interlayer insulating layer and electrically connected to a contact portion of the second semiconductor layer through a second contact hole penetrating the second interlayer insulating layer, wherein the contact portion of the second semiconductor layer may include an upper layer portion including a crystalline metal oxide, and a lower layer portion including an amorphous oxide semiconductor material.

The display apparatus may further include a metal oxide layer between the contact portion of the second semiconductor layer and the second electrode layer.

The above and other aspects, features, and advantages of certain embodiments of the disclosure will be more apparent from the following description, the accompanying drawings, and claims.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION OF THE EMBODIMENTS

Figure 1:
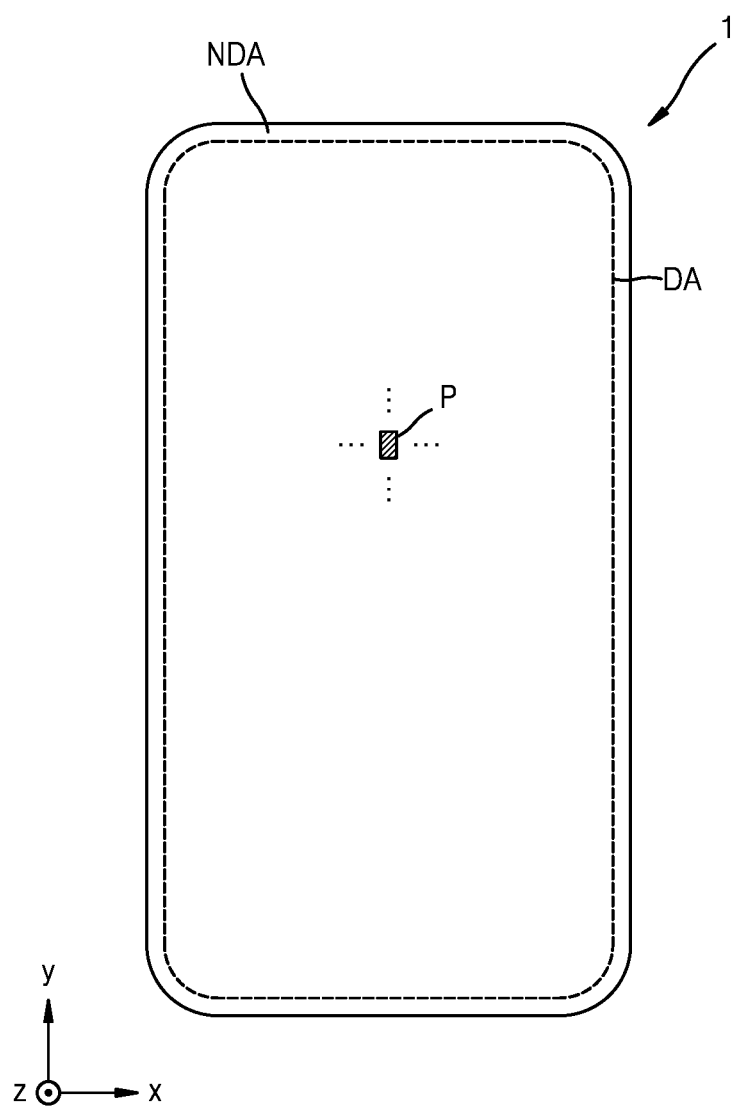
FIG. 1 is a schematic plan view of a portion of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. For example, the expression "A and/or B" indicates only A, only B, or both A and B. The expression "at least one of A and B" indicates only A, only B, or both A and B.

The terms "and" and "or" may be used in the conjunctive or disjunctive sense and should generally be interpreted as "and/or". Throughout the disclosure, the expression "at least one of a, b, and c" indicates only a, only b, only c, both a and b, both a and c, both b and c, all of a, b, and c, or variations thereof.

Because various modifications may be applied and one or more embodiments may be implemented, specific embodiments will be shown in the drawings and described in detail in the detailed description. The effects and features of the embodiments, and a method to achieve the same will become more apparent from the following embodiments that are described in detail in conjunction with the accompanying drawings. However, the embodiments may have different forms and should not be construed as being limited to the descriptions set forth herein.

It will be understood that although the terms "first," "second," etc. may be used herein to describe various elements, these elements should not be limited by these terms. These terms are only used to distinguish one element from another.

As used herein, the singular forms "a," "an," and "the" are intended to include the plural forms as well, unless the context clearly indicates otherwise.

It will be understood that terms such as "comprise," "include," and "have" used herein specify the presence of stated features or elements, but do not preclude the presence or addition of one or more other features or elements.

It will be understood that when a layer, region, or element is referred to as being "on" another layer, region, or element, it may be "directly on" the other layer, region, or element or may be "indirectly on" the other layer, region, or element with one or more intervening layers, regions, or elements therebetween.

In the following embodiments, it will be understood that when a layer, region, or element is referred to as being "connected to" or "coupled to" another layer, region, and element, it may be directly or indirectly connected or coupled to the other layer, region, or element. For example, intervening layers, regions, or elements may be present. For example, when a layer, region, or element is referred to as being electrically connected to another layer, region, or element, it can be directly electrically connected to the other layer, region, or element or indirectly electrically connected to the other layer, region, or element via intervening layers, regions, or elements.

The x-axis, the y-axis and the z-axis are not limited to three axes of the rectangular coordinate system, and may be interpreted in a broader sense. For example, the x-axis, the y-axis, and the z-axis may be perpendicular to one another or may represent different directions that are not perpendicular to one another.

When a certain embodiment may be implemented differently, a specific process order may be performed differently from the described order. For example, two processes described in succession may be performed substantially simultaneously, or may be performed in an order opposite to that described.

Sizes of elements in the drawings may be exaggerated or contracted for convenience of explanation. For example, because sizes and thicknesses of elements in the drawings may be arbitrarily illustrated for convenience of explanation, the following embodiments are not limited thereto.

The term "overlap" may include layer, stack, face or facing, extending over, extending under, covering or partly covering or any other suitable term as would be appreciated and understood by those of ordinary skill in the art. The phrase "not overlap" may include apart from or set aside from or offset from and any other suitable equivalents as would be appreciated and understood by those of ordinary skill in the art.

Terms such as "about", "approximately", and "substantially" as used herein are inclusive of the stated value and mean within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within, for example, ±30%, 20%, or 5% of the stated value.

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification FIG. 1 is a schematic plan view of a portion of a display apparatus 1 according to an embodiment.

Referring to FIG. 1, the display apparatus 1 may include a display area DA, and a peripheral area NDA outside the display area DA. Pixels P each including a display element may be arranged (disposed) in the display area DA, and the display apparatus 1 may provide an image by using light emitted from the pixels P arranged in the display area DA. The peripheral area NDA may be a non-display area in which display elements may not be arranged, and the display area DA may be entirely surrounded by the peripheral area NDA.

Although FIG. 1 illustrates a display apparatus 1 including a flat display surface, embodiments are not limited thereto. In another embodiment, the display apparatus 1 may include a three-dimensional display surface of a curved display surface.

In case that the display apparatus 1 includes a three-dimensional display surface, the display apparatus 1 includes display areas indicating different directions, and may include, for example, a polygonal columnar display surface. In another embodiment, in case that the display apparatus 1 includes a curved display surface, the display apparatus 1 may be implemented in various forms, such as flexible, foldable, or rollable display devices.

FIG. 1 illustrates a display apparatus 1 that may be applicable to a mobile phone terminal. Although not shown, electronic modules, camera modules, or power modules mounted on a main board may be arranged in brackets/cases along with the display apparatus 1, to constitute the mobile phone terminal. The display apparatus 1 according to an embodiment may be applied to large-sized electronic devices such as televisions and monitors, as well as small and medium-sized electronic devices such as tablets, car navigation systems, game consoles, and smartwatches.

Although it is shown in FIG. 1 that a corner portion of the display area DA of the display apparatus 1 has a round rectangular shape, in another embodiment, the display area DA may have a circular shape, an elliptical shape, or a polygonal shape such as a triangle or a pentagon.

Hereinbelow, although an organic light-emitting display apparatus is described as an example of the display apparatus 1 according to an embodiment, the display apparatus is not limited thereto. In another embodiment, the display apparatus 1 may be an inorganic light-emitting display, an inorganic electroluminescence (EL) display, or a quantum dot light-emitting display. For example, an emission layer of a display element provided in the display apparatus 1 may include an organic material, an inorganic material, quantum dots, an organic material and quantum dots, or an inorganic material and quantum dots.

Figure 2:
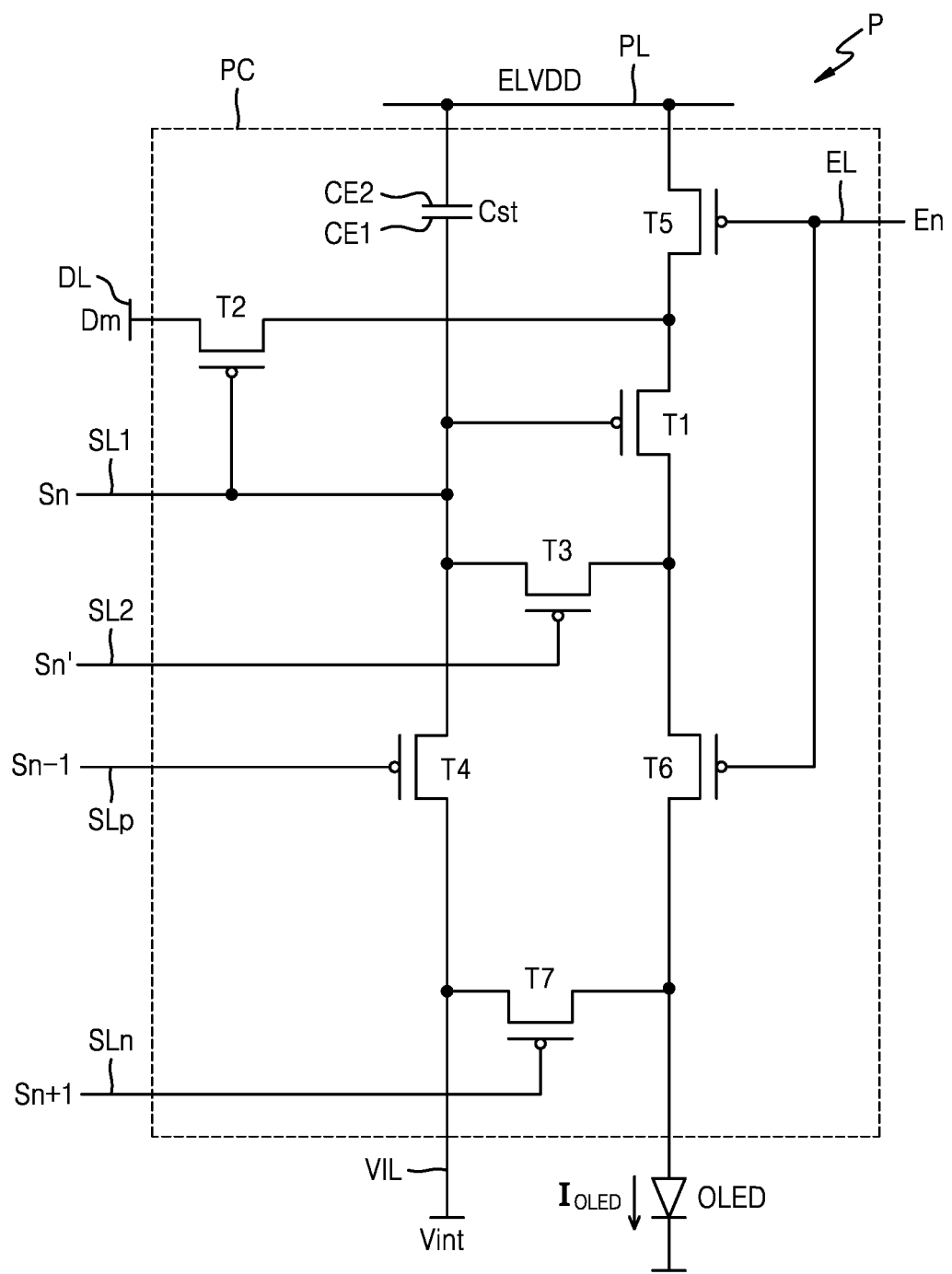
FIG. 2 is an equivalent circuit diagram of a pixel included in a display apparatus according to an embodiment.

FIG. 2 is an equivalent circuit diagram of a pixel P included in a display apparatus 1 (See FIG. 1) according to an embodiment.

Referring to FIG. 2, the pixel P may include a pixel circuit PC and an organic light-emitting diode OLED electrically connected to the pixel circuit PC.

As an example, as shown in FIG. 2, the pixel circuit PC may include thin-film transistors T1, T2, T3, T4, T5, T6, and T7 and a storage capacitor Cst. The thin-film transistors T1 to T7 and the storage capacitor Cst may be electrically connected to signal lines SL1, SL2, SLp, SLn, EL, and DL, an initialization voltage line VIL, and a driving voltage line PL. In an embodiment, at least one of the signal lines SL1, SL2, SLp, SLn, EL, and DL, the initialization voltage line VIL, and/or the driving voltage line PL may be shared by adjacent pixels P.

The thin-film transistors T1 to T7 may include a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7.

Some of the thin-film transistors T1 to T7 may each include an N-channel metal-oxide semiconductor field effect transistor (MOSFET) (NMOS), and the others thereof may each include a P-channel MOSFET (PMOS).

In an embodiment, the compensation thin-film transistor T3 and the first initialization thin-film transistor T4 among the thin-film transistors T1 to T7 may each include an NMOS, and the others thereof may each include a PMOS.

In another embodiment, the compensation thin-film transistor T3, the first initialization thin-film transistor T4, and the second initialization thin-film transistor T7 among the thin-film transistors T1 to T7 may each include an NMOS, and the others thereof may each include a PMOS. In other embodiments, only one of the thin-film transistors T1 to T7 may include an NMOS, and the others thereof may each include a PMOS. In other embodiments, all of the thin-film transistors T1 to T7 may each include an NMOS.

The signal lines may include a first scan line SL1 that transmits a first scan signal Sn, a second scan line SL2 that transmits a second scan signal Sn', a previous scan line SLp that transmits a previous scan signal Sn−1 to the first initialization thin-film transistor T4, an emission control line EL that transmits an emission control signal En to the operation control thin-film transistor T5 and the emission control thin-film transistor T6, a next scan line SLn that transmits a next scan signal Sn+1 to the second initialization thin-film transistor T7, and a data line DL that crosses the first scan line SL1 and transmits a data signal Dm.

The driving voltage line PL may be configured to transmit a driving voltage ELVDD to the driving thin-film transistor T1, and the initialization voltage line VIL may be configured to transmit an initialization voltage Vint that initializes the driving thin-film transistor T1 and a pixel electrode of the organic light-emitting diode OLED.

A driving gate electrode of the driving thin-film transistor T1 may be electrically connected to the storage capacitor Cst, a driving source area of the driving thin-film transistor T1 may be electrically connected to the driving voltage line PL via the operation control thin-film transistor T5, and a driving drain area of the driving thin-film transistor T1 may be electrically connected to the pixel electrode of the organic light-emitting diode OLED via the emission control thin-film transistor T6. The driving thin-film transistor T1 may receive the data signal Dm depending on a switching operation of the switching thin-film transistor T2 and supply a driving current IDLED to the organic light-emitting diode OLED.

A switching gate electrode of the switching thin-film transistor T2 may be electrically connected to the first scan line SL1, a switching source area of the switching thin-film transistor T2 may be electrically connected to the data line DL, and a switching drain area of the switching thin-film transistor T2 may be electrically connected to the driving source area of the driving thin-film transistor T1, and electrically connected to the driving voltage line PL via the operation control thin-film transistor T5. The switching thin-film transistor T2 may be turned on in response to the first scan signal Sn transmitted through the first scan line SL1 and perform a switching operation of transmitting the data signal Dm transmitted through the data line DL to the driving source area of the driving thin-film transistor T1.

A compensation gate electrode of the compensation thin-film transistor T3 may be electrically connected to the second scan line SL2. A compensation drain area of the compensation thin-film transistor T3 may be electrically connected to the driving drain area of the driving thin-film transistor T1, and electrically connected to the pixel electrode of the organic light-emitting diode OLED via the emission control thin-film transistor T6. A compensation source area of the compensation thin-film transistor T3 may be electrically connected to a first electrode CE1 of the storage capacitor Cst and the driving gate electrode of the driving thin-film transistor T1. Also, the compensation source area may be electrically connected to a first initialization drain area of the first initialization thin-film transistor T4.

The compensation thin-film transistor T3 may be turned on in response to the second scan signal Sn' transmitted through the second scan line SL2 and electrically connect the driving gate electrode and the driving drain area of the driving thin-film transistor T1 to each other, so as to diode-connect the driving thin-film transistor T1.

A first initialization gate electrode of the first initialization thin-film transistor T4 may be electrically connected to the previous scan line SLp. A first initialization source area of the first initialization thin-film transistor T4 may be electrically connected to a second initialization source area of the second initialization thin-film transistor T7, and the initialization voltage line VIL. The first initialization drain area of the first initialization thin-film transistor T4 may be electrically connected to the first electrode CE1 of the storage capacitor Cst, the compensation source area of the compensation thin-film transistor T3, and the driving gate electrode of the driving thin-film transistor T1. The first initialization thin-film transistor T4 may be turned on in response to the previous scan signal Sn−1 transmitted through the previous scan line SLp and perform an initialization operation of initializing a voltage of the driving gate electrode of the driving thin-film transistor T1 by transmitting the initialization voltage Vint to the driving gate electrode of the driving thin-film transistor T1.

An operation control gate electrode of the operation control thin-film transistor T5 may be electrically connected to the emission control line EL, an operation control source area of the operation control thin-film transistor T5 may be electrically connected to the driving voltage line PL, and an operation control drain area of the operation control thin-film transistor T5 may be electrically connected to the driving source area of the driving thin-film transistor T1 and the switching drain area of the switching thin-film transistor T2.

An emission control gate electrode of the emission control thin-film transistor T6 may be electrically connected to the emission control line EL, an emission control source area of the emission control thin-film transistor T6 may be electrically connected to the driving drain area of the driving thin-film transistor T1 and the compensation drain area of the compensation thin-film transistor T3, and an emission control drain area of the emission control thin-film transistor T6 may be electrically connected to a second initialization drain area of the second initialization thin-film transistor T7 and the pixel electrode of the organic light-emitting diode OLED.

The operation control thin-film transistor T5 and the emission control thin-film transistor T6 may be simultaneously turned on in response to the emission control signal En transmitted through the emission control line EL and cause the driving voltage ELVDD to be transmitted to the organic light-emitting diode OLED, so that the driving current IDLED flows through the organic light-emitting diode OLED.

A second initialization gate electrode of the second initialization thin-film transistor T7 may be electrically connected to the next scan line SLn, the second initialization drain area of the second initialization thin-film transistor T7 may be electrically connected to the emission control drain area of the emission control thin-film transistor T6 and the pixel electrode of the organic light-emitting diode OLED, and the second initialization source area of the second initialization thin-film transistor T7 may be electrically connected to the first initialization source area of the first initialization thin-film transistor T4, and the initialization voltage line VIL. The second initialization thin-film transistor T7 may be turned on in response to the next scan signal Sn+1 transmitted through the next scan line SLn and initialize the pixel electrode of the organic light-emitting diode OLED.

As shown in FIG. 2, the second initialization thin-film transistor T7 may be electrically connected to the next scan line SLn. In another embodiment, the second initialization thin-film transistor T7 may be electrically connected to the emission control line EL and driven according to the emission control signal En. Positions of the source areas and the drain areas may be switched according to types of transistors, e.g., a p-type or an n-type.

The storage capacitor Cst may include the first electrode CE1 and a second electrode CE2. The first electrode CE1 of the storage capacitor Cst may be electrically connected to the driving gate electrode of the driving thin-film transistor T1, and the second electrode CE2 of the storage capacitor Cst may be electrically connected to the driving voltage line PL. An electric charge corresponding to a difference between a voltage of the driving gate electrode of the driving thin-film transistor T1 and the driving voltage ELVDD may be stored in the storage capacitor Cst.

A detailed operation of each pixel P according to an embodiment is as follows.

During an initialization period, in case that the previous scan signal Sn−1 may be supplied through the previous scan line SLp, the first initialization thin-film transistor T4 may be turned on in response to the previous scan signal Sn−1, and the driving thin-film transistor T1 may be initialized by the initialization voltage Vint supplied from the initialization voltage line VIL.

During a data programming period, in case that the first scan signal Sn and a second scan line Sn' may be supplied through the first scan line SL1 and the second scan line SL2, respectively, the switching thin-film transistor T2 and the compensation thin-film transistor T3 may be turned on in response to the first scan signal Sn and the second scan line Sn', respectively. In this regard, the driving thin-film transistor T1 may be diode-connected by the compensation thin-film transistor T3 that has been turned on, and may be biased forward.

A compensation voltage (Dm+Vth, where Vth may be a negative value), which may be less than the data signal Dm supplied through the data line DL by a threshold voltage (Vth) of the driving thin-film transistor T1, may be applied to a driving gate electrode of the driving thin-film transistor T1.

The driving voltage ELVDD and the compensation voltage (Dm+Vth) may be applied to both ends of the storage capacitor Cst, and an electric charge corresponding to a difference between voltages at both ends may be stored in the storage capacitor Cst.

During an emission period, the operation control thin-film transistor T5 and the emission control thin-film transistor T6 may be turned on by the emission control signal En supplied from the emission control line EL. A driving current IDLED caused by the difference between the voltage of the driving gate electrode of the driving thin-film transistor T1 and the driving voltage ELVDD, and the driving current IDLED may be supplied to the organic light-emitting diode OLED through the emission control thin-film transistor T6.

In an embodiment, at least one of the first to seventh thin-film transistors T1 to T7 includes an oxide-containing semiconductor layer, and the others thereof may include a silicon-containing semiconductor layer.

In detail, the driving thin-film transistor T1 that influences (e.g., directly influences) the brightness of a display apparatus may be configured to include a semiconductor layer containing polycrystalline silicon with high reliability. In this manner, a high-resolution display apparatus may be implemented.

Because an oxide semiconductor may have high carrier mobility and low leakage current, an amount of a voltage drop may not be large even in case that a driving time may be long. For example, because a color change of an image due to the voltage drop may not be significant even during low frequency driving, low frequency driving may be enabled.

As such, the oxide semiconductor may have a small leakage current, and thus, in case that at least one of the compensation thin-film transistor T3, the first initialization thin-film transistor T4, and the second initialization thin-film transistor T7, which may be electrically connected to the driving gate electrode of the driving thin-film transistor T1, includes the oxide semiconductor, the leakage current that may flow into the driving gate electrode of the driving thin-film transistor T1 may be prevented, and the power consumption may be reduced.

Figure 3:
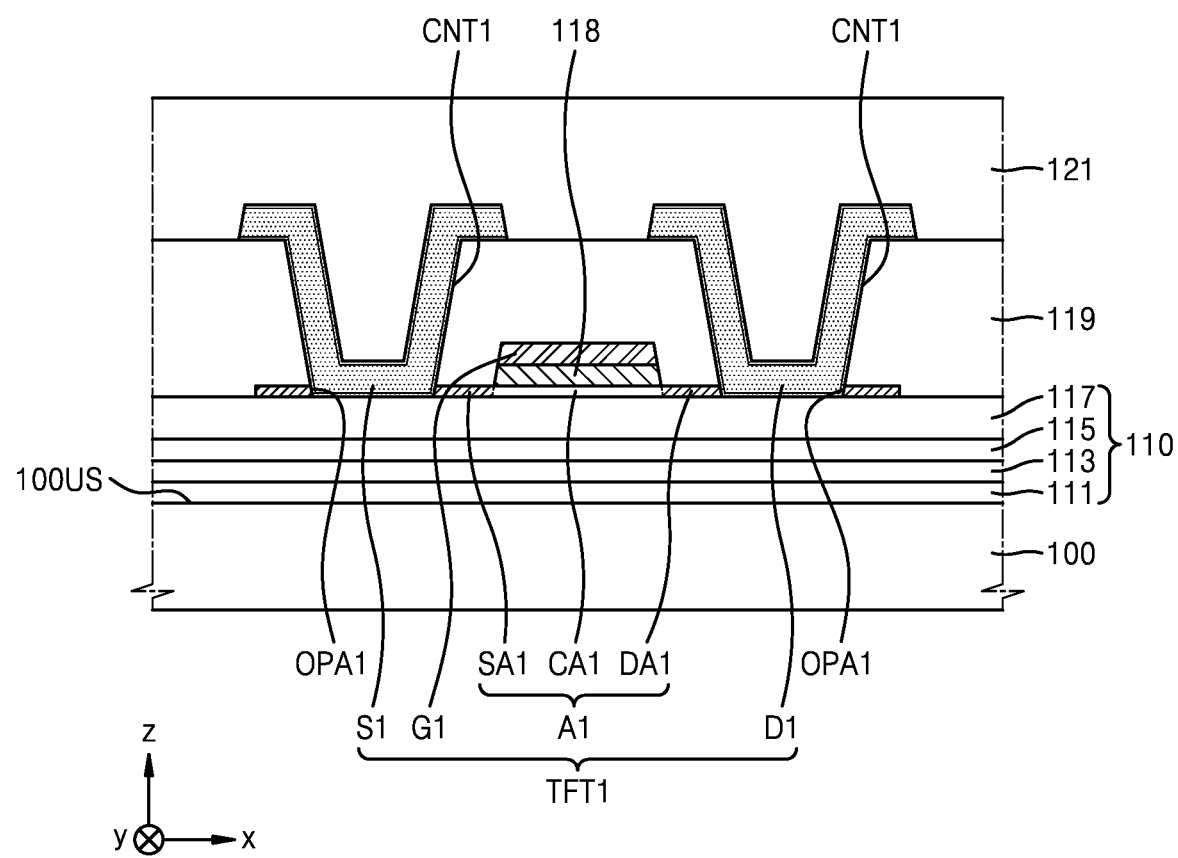
FIG. 3 is a schematic cross-sectional view of a thin-film transistor included in a display apparatus according to an embodiment.

FIG. 3 is a schematic cross-sectional view of a thin-film transistor included in a display apparatus 1 (See FIG. 1) according to an embodiment.

Referring to FIG. 3, one or more insulating layers 110 may be arranged on a substrate 100, and a first thin-film transistor TFT1 may be arranged on the insulating layers 110. The insulating layers 110 may include a buffer layer 111, a first gate insulating layer 113, a second gate insulating layer 115, and a first interlayer insulating layer 117. However, embodiments are not limited thereto, and the insulating layers 110 may include only some of the buffer layer 111, the first gate insulating layer 113, the second gate insulating layer 115, and the first interlayer insulating layer 117.

The first thin-film transistor TFT1 may include a first semiconductor layer A1, a first gate electrode G1 arranged to at least partially overlap the first semiconductor layer A1, and a first electrode layer, e.g., a first source electrode S1 and/or a first drain electrode D1, electrically connected to the first semiconductor layer A1. Although FIG. 3 illustrates a first thin-film transistor TFT1 of a top-gate type in which the first gate electrode G1 may be positioned on the first semiconductor layer A1, in another embodiment, the first thin-film transistor TFT1 may be provided of a bottom-gate type in which the first gate electrode G1 may be positioned under the first semiconductor layer A1.

The first semiconductor layer A1 may include an oxide semiconductor material. The first semiconductor layer A1 may include an oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), and zinc (Zn). For example, the first semiconductor layer A1 may be an InSnZnO (ITZO) semiconductor layer, an InGaZnO (IGZO) semiconductor layer, etc.

In an embodiment, the first semiconductor layer A1 according to an embodiment may include an amorphous oxide semiconductor material among oxide semiconductor materials. For example, the first semiconductor layer A1 may be an amorphous a-ITZO semiconductor layer, an amorphous a-IGZO semiconductor layer, etc. Here, the term "amorphous" oxide semiconductor material may mean that, even though semiconductor layers may be formed of the same oxide semiconductor material, they may not be crystalized and exist in an amorphous state.

The first semiconductor layer A1 may include a channel area CA1, and a source area SA1 and a drain area DA1 respectively arranged on opposite sides of the channel area CA1 with the channel area CA1 at the center therebetween. The source area SA1 and the drain area DA1 may have higher electrical conductivity than the channel area CA1.

A third gate insulating layer 118 may be arranged on the first semiconductor layer A1. In case that the third gate insulating layer 118 may be patterned to overlap a portion of the first semiconductor layer A1, an area in which the third gate insulating layer 118 and the first semiconductor layer A1 overlap each other may be provided as the channel area CA1, and the other areas may be provided as the source area SA1 and the drain area DA1.

In case that the source area SA1 and the drain area DA1 of the first semiconductor layer A1 go through a process such as conductorization by plasma treatment or impurity doping, a portion of the first semiconductor layer A1 that overlaps the third gate insulating layer 118 may not be exposed to plasma treatment or impurity doping, and thus has properties different from those of the source area SA1 and the drain area DA1. For example, during plasma treatment or impurity doping on the first semiconductor layer A1, the third gate insulating layer 118 may be used as a self-align mask, so that a channel area CA1, which may not be doped with impurities, may be formed at a location overlapping the third gate insulating layer 118, and a source area SA1 and a drain area DA1, which may be doped with impurities, may be formed on both sides of the channel area CA1.

The first gate electrode G1 may be positioned on the third gate insulating layer 118. For example, the first gate electrode G1 may include a single layer or multiple layers of one or more metals selected from the group consisting of aluminum (Al), platinum (Pt), palladium (Pd), silver (Ag), magnesium (Mg), gold (Au), nickel (Ni), neodymium (Nd), iridium (Ir), Cr, lithium (Li), calcium (Ca), molybdenum (Mo), Ti, tungsten (W), and/or copper (Cu). In an embodiment, after the channel area CA1 may be doped with impurities, in case that the third gate insulating layer 118 may be patterned using the first gate electrode G1 as a mask, the third gate insulating layer 118 may also have substantially a same shape as the first gate electrode G1.

A second interlayer insulating layer 119 may be arranged on the first gate electrode G1 so as to cover the first gate electrode G1 and a portion of the first semiconductor layer A1, for example, the source area SA1 and the drain area DA1. First contact holes CNT1 may be formed in the second interlayer insulating layer 119 to expose at least portions of the source area SA1 and the drain area DA1. Although it is shown in FIG. 3 that the first contact holes CNT1 that respectively expose the source area SA1 and the drain area DA1 may be formed in the second interlayer insulating layer 119, in some cases, a first contact hole CNT1 may be formed to expose one of the source area SA1 and the drain area DA1. The first electrode layer arranged on the second interlayer insulating layer 119 may be electrically connected to the first semiconductor layer A1 through the first contact holes CNT1.

The first electrode layer, for example, the first source electrode S1 and the first drain electrode D1, may be arranged on the second interlayer insulating layer 119. Each of the first source electrode S1 and the first drain electrode D1 may be electrically connected to the first semiconductor layer A1 through each first contact hole CNT1 defined in the second interlayer insulating layer 119. Each of the first source electrode S1 and the first drain electrode D1 may include a single layer or multiple layers of one or more metals selected from, for example, Al, Pt, Pd, Ag, Mg, Au, Ni, Nd, Ir, Cr, Li, Ca, Mo, Ti, W, and Cu. In an embodiment, the first source electrode S1 and the first drain electrode D1 may each include a single layer of Mo, Al, etc., or a combination thereof, or multiple layers of Mo/Al/Mo, Ti/Al/Ti, etc.

A planarization layer 121 may be arranged on the first source electrode S1 and the first drain electrode D1.

The source area SA1 and the drain area DA1 of the first semiconductor layer A1 according to an embodiment may each include an opening OPA1 corresponding to each first contact hole CNT1. The opening OPA1 may be provided to penetrate each of the source area SA1 and the drain area DA1 of the first semiconductor layer A1 and may expose at least a portion of an upper surface of the first interlayer insulating layer 117 under the first semiconductor layer A1. Accordingly, the first source electrode S1 and the first drain electrode D1 electrically connected to the first semiconductor layer A1 through the first contact holes CNT1 may be in contact with the upper surface of the first interlayer insulating layer 117 that may be exposed by the openings OPA1.

As described above, because the first semiconductor layer A1 may have the openings OPA1 corresponding to the first contact holes CNT1, the first source electrode S1 and the first drain electrode D1 may come in direct contact with an inner surface of the first semiconductor layer A1 forming the openings OPA1, and thus be electrically connected to the first semiconductor layer A1. Through this structure, the first thin-film transistor TFT1 according to an embodiment may implement more stable device characteristics. With regard to this, a detailed description thereof will be provided with reference to FIGS. 4 through 14.

Figure 4:
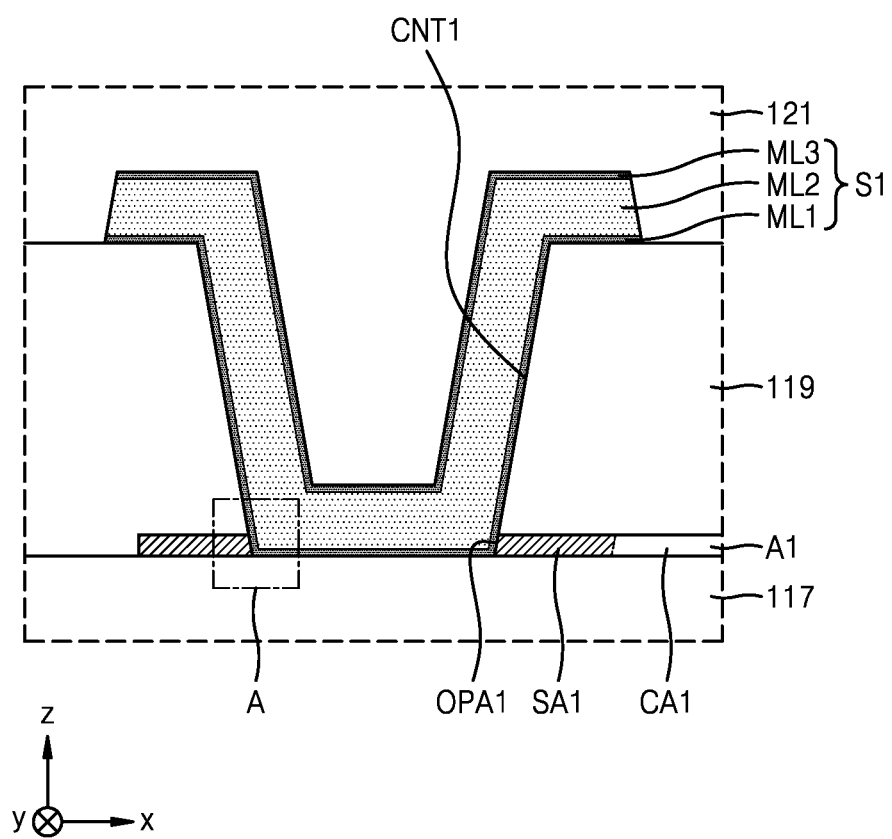
FIG. 4 is a schematic cross-sectional view of a portion of a thin-film transistor according to an embodiment.
Figure 5:
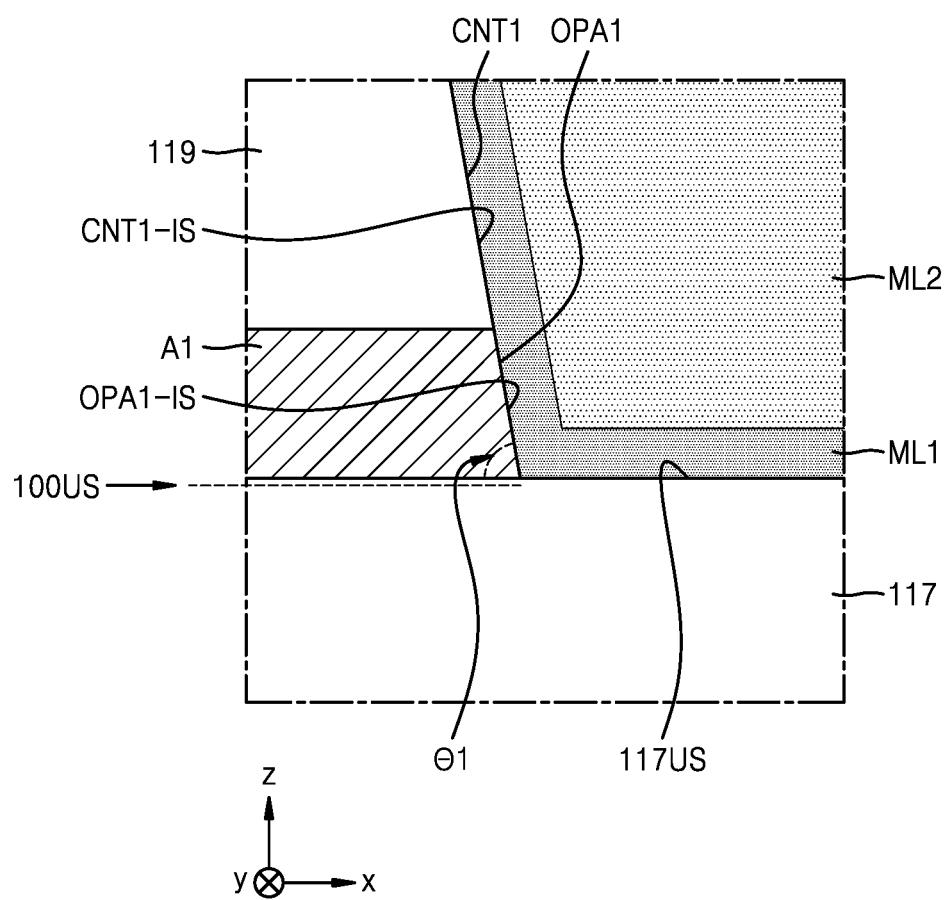
FIG. 5 is an enlarged schematic cross-sectional view of region A of FIG. 4.

FIG. 4 is a schematic cross-sectional view of a portion of a thin-film transistor according to an embodiment, and FIG. 5 is an enlarged schematic cross-sectional view of region A of FIG. 4.

Referring to FIGS. 4 and 5, FIG. 4 illustrates a contact structure of the first source electrode S1 and the first semiconductor layer A1 of the first thin-film transistor TFT1 of FIG. 3 described above. Although FIG. 4 is illustrated and described based on the first source electrode S1, the same structure may be applied to the first drain electrode D1.

The first source electrode S1 may include a first metal layer ML1, a third metal layer ML3, and a second metal layer ML2 therebetween. In an embodiment, the first metal layer ML1 and the third metal layer ML3 may include the same material as each other. For example, the first metal layer ML1 and the third metal layer ML3 may include Mo, and the second metal layer ML3 may include Al. A thickness of the second metal layer ML2 may be greater than thicknesses of the first metal layer ML1 and the third metal layer ML3.

The first source electrode S1 may be electrically connected to the first semiconductor layer A1 through the first contact hole CNT1 and may be electrically connected (e.g., directly connected) to an inner surface OPA1-IS of the opening OPA1 penetrating the first semiconductor layer A1, and thus may be in electrical communication with the first semiconductor layer A1.

Referring to FIG. 5, an angle θ1 between an upper surface 100US of the substrate 100 and the inner surface OPA1-IS of the opening OPA1 penetrating the first semiconductor layer A1 may be about 30° or greater. In an embodiment, the angle θ1 between the upper surface 100US of the substrate 100 and the inner surface OPA1-IS of the opening OPA1 may be about 30° to about 90°, for example, about 40° to about 80°. As described above, an upper limit of the angle θ1 may be set to about 90°, but may also be about 90° or greater. However, in order for the angle θ1 to be formed at about 90° or greater, the inner surface OPA1-IS of the opening OPA1 may need to be formed in an undercut shape.

Also, in embodiments, a surface the serves as a reference for measuring the angle θ1 of the inner surface OPA1-IS may be the upper surface 100US of the substrate 100. This may be understood to reduce damage to the first semiconductor layer A1 and minimize oxide bonds on a surface of the first semiconductor layer A1 during dry etching by forming the angle θ1 of the inner surface OPA1-IS with a high slope of about 30° or greater, in case that an angle of the dry etching for forming a first contact hole CNT1 may be perpendicular to the upper surface 100US of the substrate 100.

Although it is shown in FIGS. 4 and 5 that the inner surface OPA1-IS of the opening OPA1 and an inner surface CNT1-IS of the first contact hole CNT1 may be formed on the same surface to have the same angle, embodiments are not limited thereto.

The first metal layer ML1 of the first source electrode S1 may contact (e.g., directly contact) the inner surface CNT1-IS of the first contact hole CNT1, the inner surface OPA1-IS of the opening OPA1, and an upper surface 117US of the first interlayer insulating layer 117, the upper surface 117US being exposed through the opening OPA1.

Figure 6:
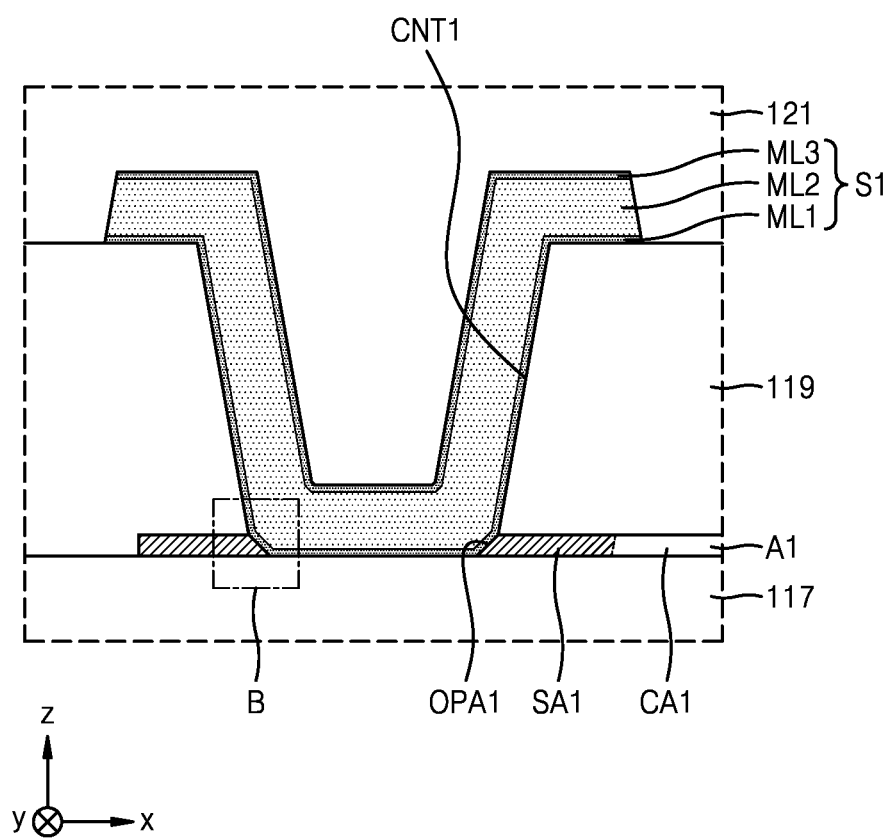
FIG. 6 is a schematic cross-sectional view of a portion of a thin-film transistor according to an embodiment.
Figure 7:
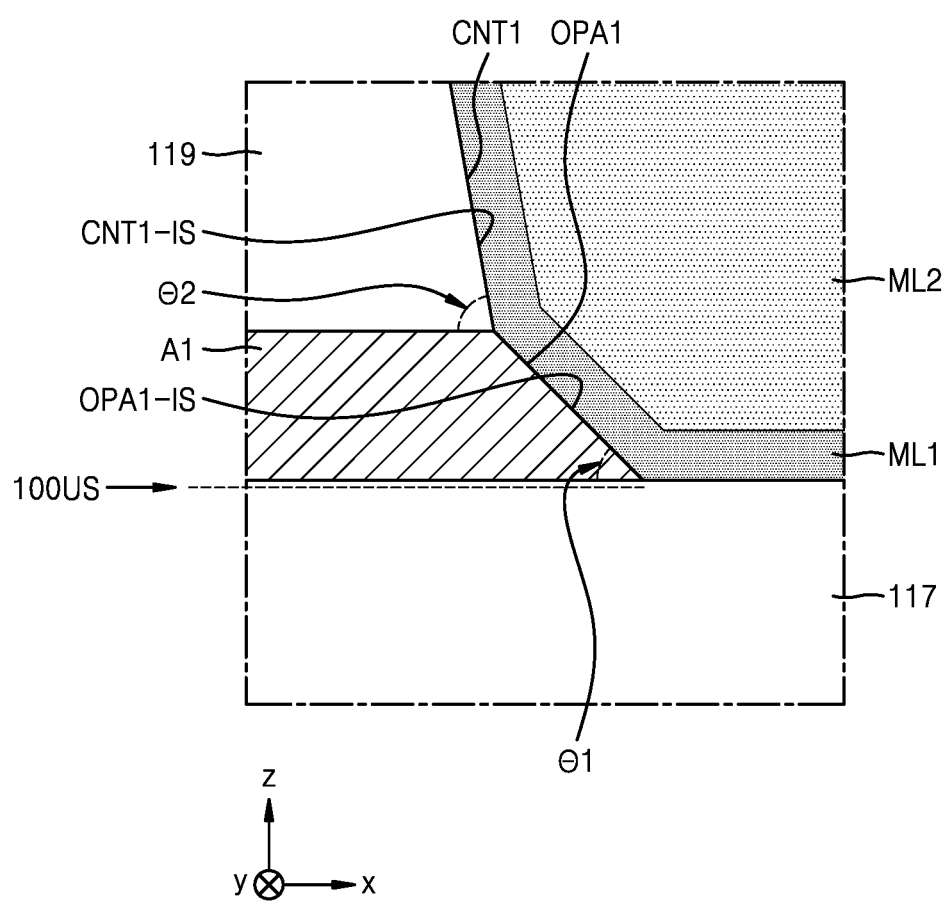
FIG. 7 is an enlarged schematic cross-sectional view of region B of FIG. 6.

FIG. 6 is a schematic cross-sectional view of a portion of a thin-film transistor according to an embodiment, and FIG. 7 is an enlarged schematic cross-sectional view of region B of FIG. 6.

Embodiments of FIGS. 6 and 7 may differ from the aforementioned embodiments of FIGS. 4 and 5 in the angle θ1 of the inner surface OPA1-IS of the opening OPA1. Because other configurations may be the same as those shown in FIGS. 3 to 5, differences will be described hereinbelow.

Referring to FIGS. 6 and 7, with respect to the upper surface 100US of the substrate 100, the angle θ1 of the inner surface OPA1-IS of the opening OPA1 penetrating the first semiconductor layer A1 may be less than an angle θ2 of the inner surface CNT1-IS of the first contact hole CNT1. In other words, the angle θ2 of the inner surface CNT1-IS of the first contact hole CNT1 may be steeper than the angle θ1 of the inner surface OPA1-IS of the opening OPA1. The shape may be due to a difference in materials forming the first semiconductor layer A1 and the second interlayer insulating layer 119. However, even in this case, the angle θ1 of the inner surface OPA1-IS of the opening OPA1 may have a high slope of about 30° or greater. An angle θ1 of a first surface IS1 may be about 30° to about 90°, for example, about 40° to about 80°.

As a comparative example, a case may be assumed, in which a first semiconductor layer does not include an opening corresponding to a first contact hole, and a portion of an upper surface of the first semiconductor layer may be exposed by the first contact hole, so that a first electrode layer comes in contact with the first semiconductor layer through the first contact hole. A process of etching a second interlayer insulating layer may be performed to form the first contact hole, and an etching direction may be perpendicular to a direction of a substrate. In this process, the upper surface of the first semiconductor layer may be perpendicular to the etching direction. Thus, significant damage may be caused to the upper surface of the first semiconductor layer. Also, a greater amount of oxide bonds may be dissociated from a surface of the first semiconductor layer, and the dissociated oxide bonds may react with a metal material of the first electrode layer connected to the first semiconductor layer through the first contact hole, thereby forming a metal oxide layer on the surface of the first semiconductor layer. The metal oxide layer may cause problems such as increased resistance of the first semiconductor layer in a first contact area and generation of dispersion of a first thin-film transistor.

Therefore, in the first thin-film transistor TFT1 according to an embodiment, the first semiconductor layer A1 may include an opening OPA1 corresponding to the first contact hole CNT1, thereby eliminating the risk of causing defects due to a significant damage to an etching direction as in the comparative example. At the same time, the first electrode layer may be electrically connected to the first semiconductor layer A1 by bringing the inner surface OPA1-IS of the opening OPA1 and the first electrode layer into contact with each other, and the angle θ1 of the inner surface OPA1-IS of the opening OPA1 has a high slope of about 30° or greater. Thus, when the first contact hole CNT1 may be formed, damage due to the etching direction may be minimized, so that oxide bonds may be dissociated from a surface of the first semiconductor layer A1, thereby effectively preventing formation of a metal oxide layer.

Figure 8:
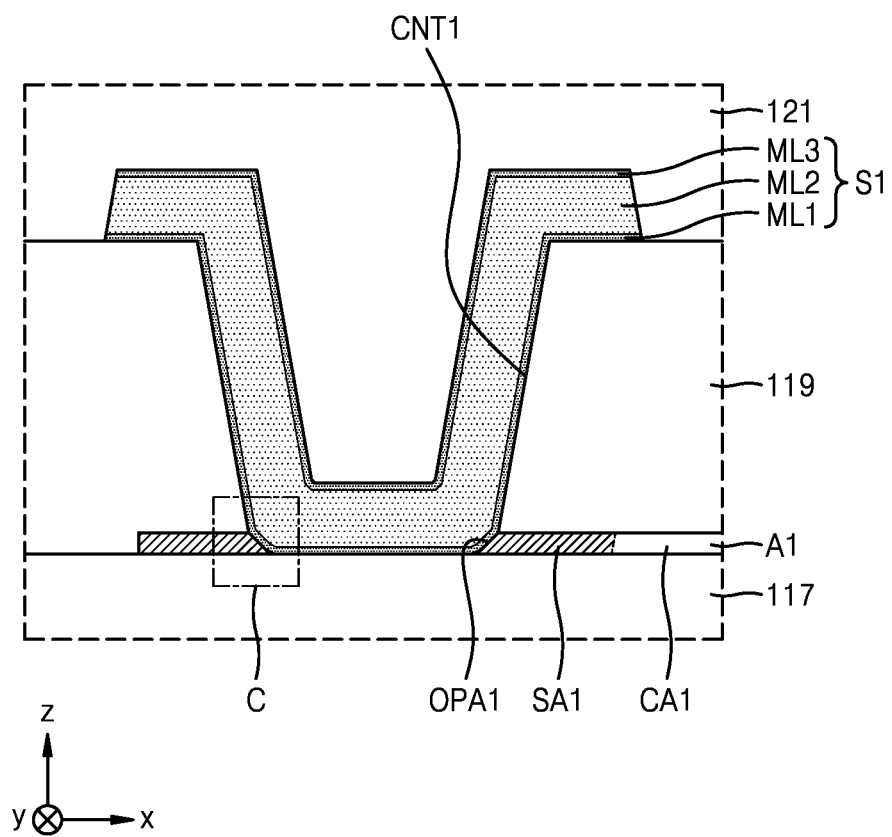
FIG. 8 is a schematic cross-sectional view of a portion of a thin-film transistor according to an embodiment.
Figure 9:
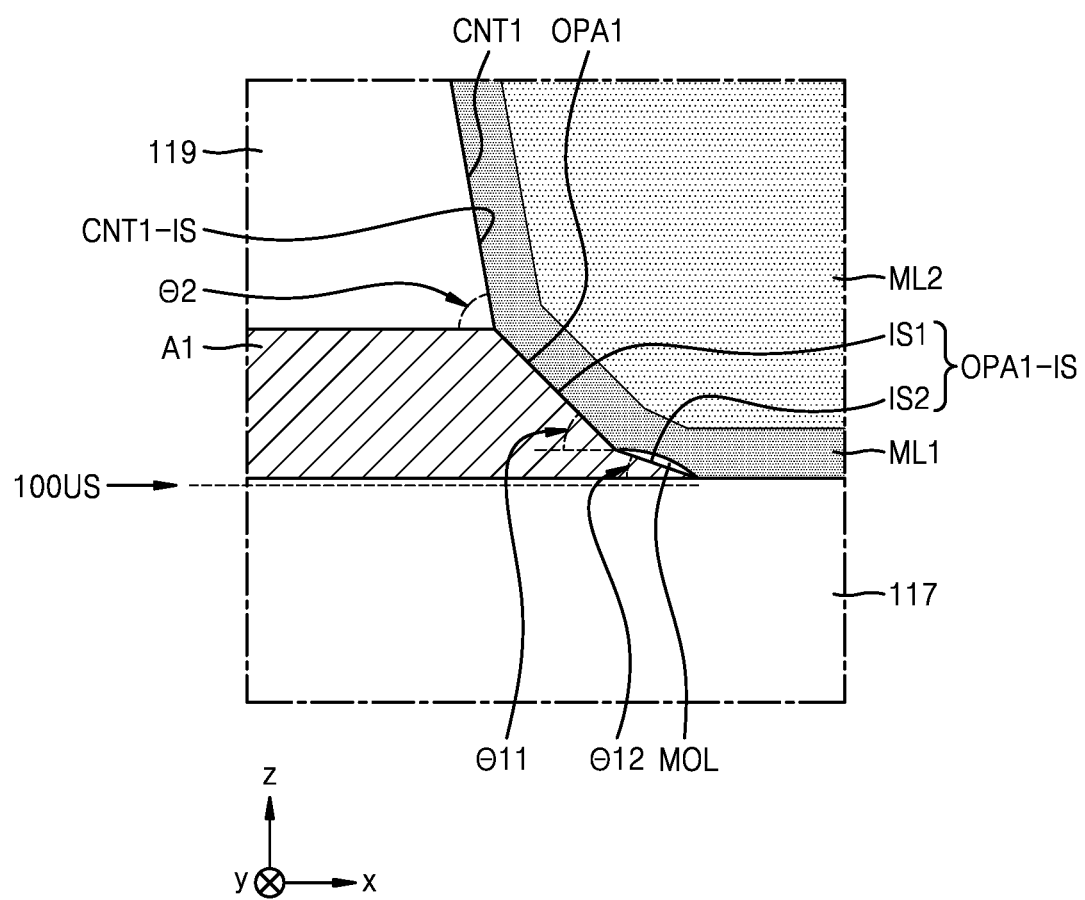
FIG. 9 is an enlarged schematic cross-sectional view of region C of FIG. 8.
Figure 10A:
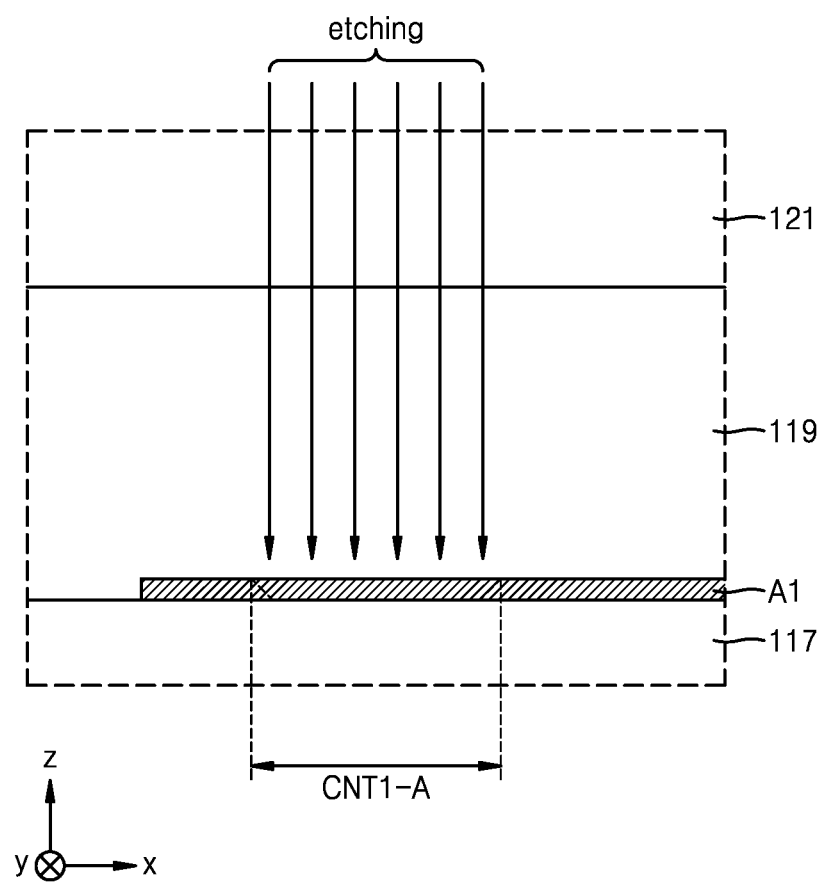
FIGS. 10A and 10B are schematic cross-sectional views showing a manufacturing process to implement the embodiments of FIGS. 8 and 9.
Figure 10B:
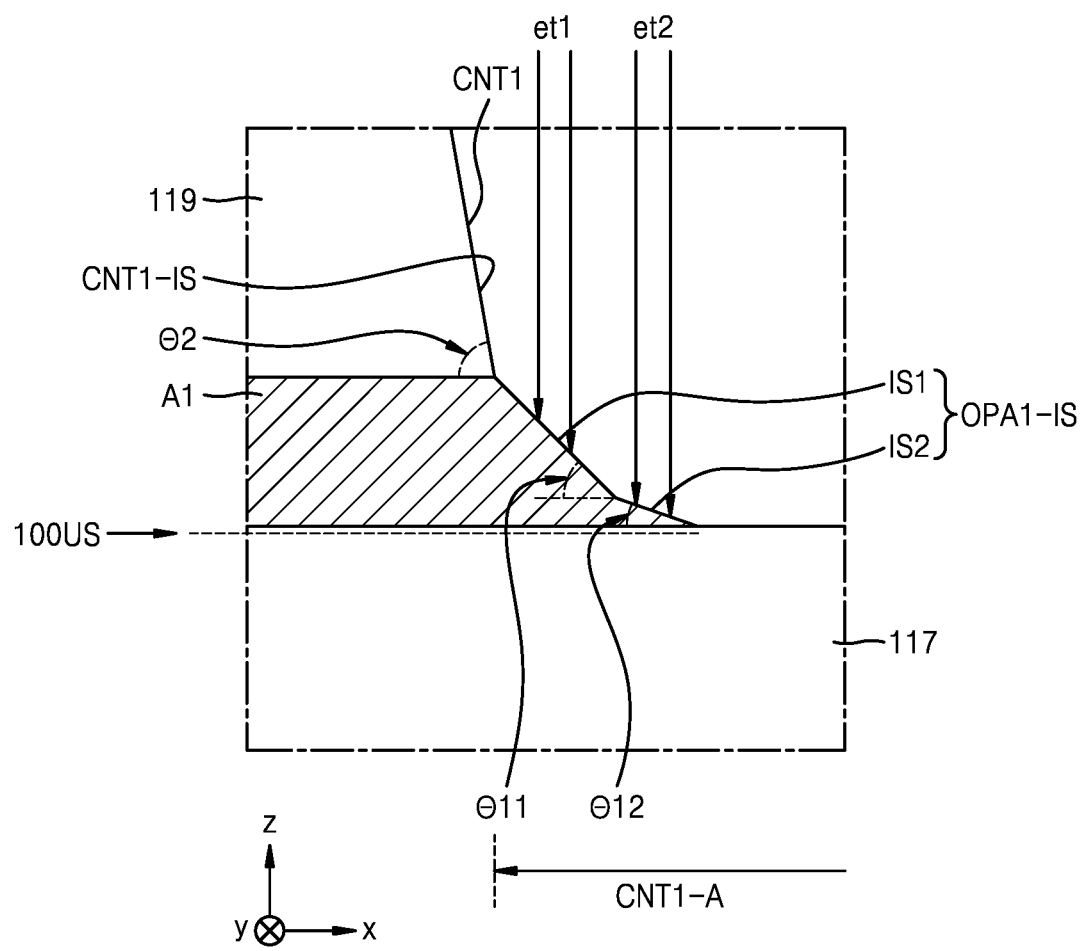

FIG. 8 is a schematic cross-sectional view of a portion of a thin-film transistor according to an embodiment, and FIG. 9 is an enlarged schematic cross-sectional view of region C of FIG. 8. FIGS. 10A and 10B are schematic cross-sectional views of parts of a manufacturing process to implement the embodiments of FIGS. 8 and 9.

Embodiments of FIGS. 8 and 9 may differ from the aforementioned embodiments in an angle of the inner surface OPA1-IS of the opening OPA1. Because other configurations may be the same as those shown in FIGS. 3 to 5, differences will be described hereinbelow.

Referring to FIGS. 8 and 9, the inner surface OPA1-IS of the opening OPA1 may include at least two surfaces having different angles. In an embodiment, the inner surface OPA1-IS of the opening OPA1 may include a first surface IS1 and a second surface IS2 having different angles. The first surface IS1 may be a main surface having a surface area larger than that of the second surface IS2, and an angle θ11 of the first surface IS1 may have a high slope of about 30° or greater with respect to the upper surface 100US of the substrate 100. The angle θ11 of the first surface IS1 may be about 30° to about 90°, for example, about 40° to about 80°.

With respect to the upper surface 100US of the substrate 100, an angle θ12 of the second surface IS2 may be less than the angle θ11 of the first surface IS1. For example, the angle θ12 of the second surface IS2 may be less than about 30°. As such, as the angle θ12 of the second surface IS2 may have a small slope of less than about 30°, a metal oxide layer MOL may be positioned on the second surface IS2. In a process of forming the first contact hole CNT1, because the angle θ12 of the second surface IS2 has a small slope, a significant damage may be caused due to an etching direction. Thus, oxide bonds on a surface of the second surface IS2 may be dissociated and bonded to a material of the first electrode layer, which may consequently form the metal oxide layer MOL. As in the aforementioned comparative example, the metal oxide layer MOL may increase resistance and dispersion of the first semiconductor layer A1, thereby deteriorating performance of the first thin-film transistor TFT1. Therefore, it may be important to minimize formation of the metal oxide layer MOL.

Unlike the second surface IS2, the metal oxide layer MOL may not be provided on the first surface IS1. This will be described in detail with reference to a manufacturing process of FIGS. 10A and 10B.

The first contact hole CNT1 may be formed by etching a portion of the second interlayer insulating layer 119, as shown in FIG. 10A. An area from which the portion of the second interlayer insulating layer 119 may be removed may be a first contact area CNT1-A, and a portion of the first semiconductor layer A1 and a portion of the first interlayer insulating layer 117 may be exposed through the first contact area CNT1-A. In an embodiment, dry etching or wet etching may be used for a process of etching the portion of the second interlayer insulating layer 119.

In the process of etching the portion of the second interlayer insulating layer 119, as shown in FIG. 10B, a portion of the first semiconductor layer A1 corresponding to the first contact hole CNT1 may be etched together, and the opening OPA1 may be formed in the first semiconductor layer A1. In this process, the first surface IS1 and the second surface IS2 having different angles may be formed on the inner surface OPA1-IS of the opening OPA1.

The first surface IS1 may have a high slope of about 30° or greater, about 40° to about 80°, and the second surface IS2 may have a small slope of less than about 30°. With regard to an angle at which each of the first surface IS1 and the second surface IS2 contacts an etching material, a contact angle between the second surface IS2 and an etching material et2 may be approximately equal to a right angle when compared to a contact angle between the first surface IS1 and an etching material et1. As described above, as a contact angle between an etching surface and an etching material may be approximately equal to a right angle, damage to the etching surface increases. With this principle, a greater amount of oxide bonds may be dissociated from a surface of the second surface IS2 when compared to a surface of the first surface IS1, and the dissociated oxide bonds may be bonded to a metal material, so that the metal oxide layer MOL may be formed as shown in FIG. 9.

Figure 11:
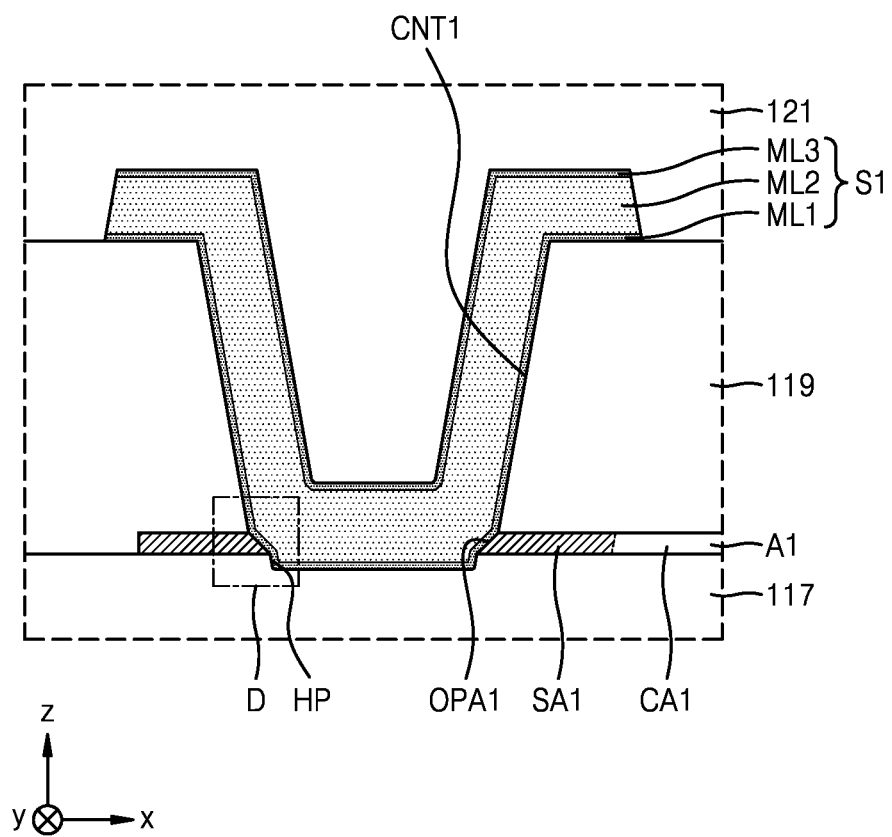
FIG. 11 is a schematic cross-sectional view of a portion of a thin-film transistor according to an embodiment.
Figure 12:
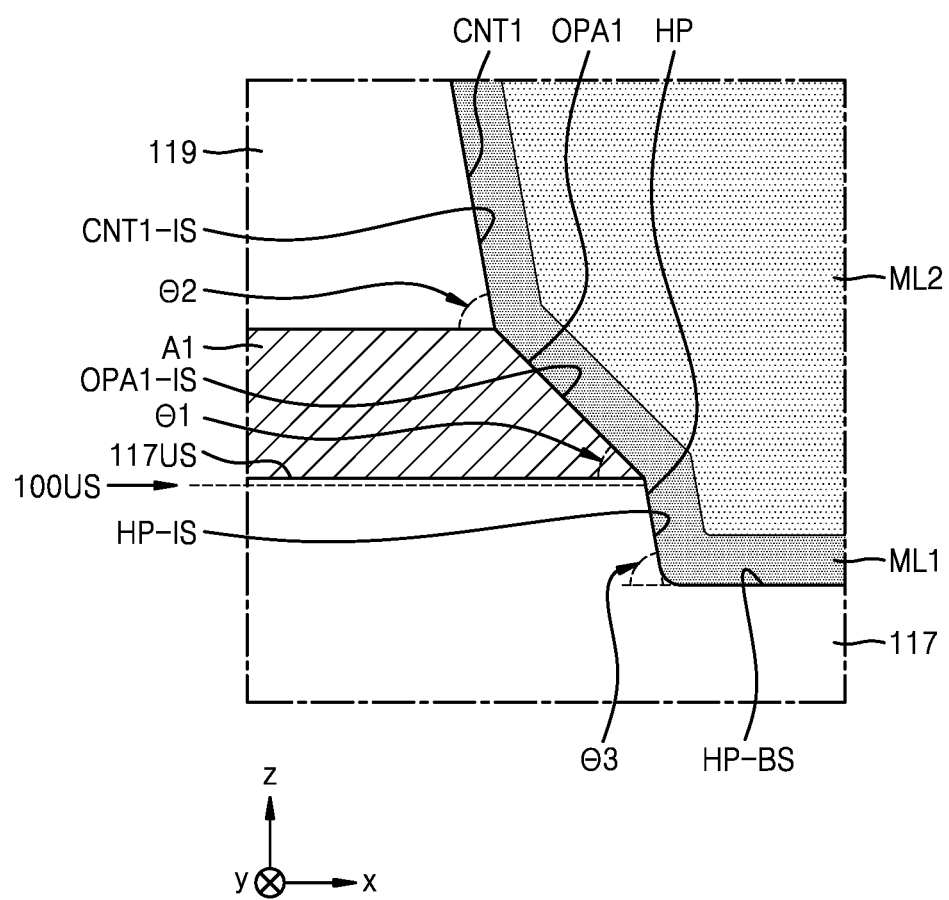
FIG. 12 is an enlarged schematic cross-sectional view of region D of FIG. 11.

FIG. 11 is a schematic cross-sectional view of a portion of a thin-film transistor according to an embodiment, and FIG. 12 is an enlarged schematic cross-sectional view of region D of FIG. 11.

Embodiments of FIGS. 11 and 12 may differ from the aforementioned embodiments in a shape of a lower portion of the opening OPA1. Because other configurations may be the same as those shown in FIGS. 3 to 5, differences will be described hereinbelow.

Referring to FIGS. 11 and 12, the first interlayer insulating layer 117 may include a groove portion HP corresponding to the opening OPA1 of the first semiconductor layer A1. The groove portion HP may be formed by removing at least a portion of the first interlayer insulating layer 117 in a thickness direction. As described above with reference to FIGS. 10A and 10B, the groove portion HP may be formed by etching a portion of the first interlayer insulating layer 117 together, in the process of etching the portion of the second interlayer insulating layer 119 to form the first contact hole CNT1. The groove portion HP may be formed by completely removing a portion of the first interlayer insulating layer 117, the portion being exposed by the opening OPA1. A bottom surface HP-BS of the groove portion HP may be provided lower than the upper surface 117US of the first interlayer insulating layer 117, on which the first semiconductor layer A1 may be arranged.

In an embodiment, a slope of an inner surface HP-IS of the groove portion HP may be steeper than a slope of the inner surface OPA1-IS of the opening OPA1. For example, with respect to the upper surface 100US of the substrate 100, an angle θ3 of the inner surface HP-IS of the groove portion HP may be greater than the angle θ1 of the inner surface OPA1-IS of the opening OPA1. The first interlayer insulating layer 117 and the second interlayer insulating layer 119, in which the groove portion HP and the first contact hole CNT1 may be respectively formed, may include an organic and/or inorganic insulating material and thus may include sloped surfaces with a substantially identical or similar angle. Accordingly, the slope of the inner surface HP-IS of the groove portion HP and a slope of the inner surface CNT1-IS of the first contact hole CNT1 may be steeper than the slope of the inner surface OPA1-IS of the opening OPA1.

The groove portion HP may include an inner surface HP-IS extending in a direction from the inner surface OPA1-IS of the opening OPA1 to the substrate 100. When forming the opening OPA1, the groove portion HP may be formed in the first interlayer insulating layer 117 together with the opening OPA1, which makes it easier to form the angle θ1 of the inner surface OPA1-IS of the opening OPA1 with a high slope of about 30° or greater.

Figure 13:
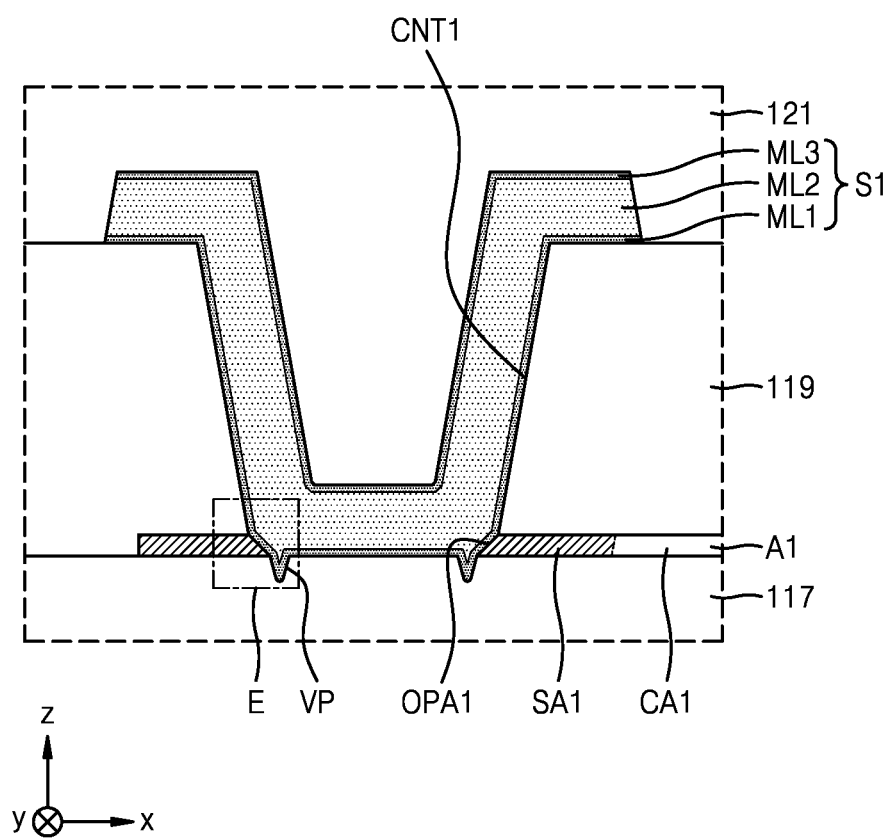
FIG. 13 is a schematic cross-sectional view of a portion of a thin-film transistor according to an embodiment.
Figure 14:
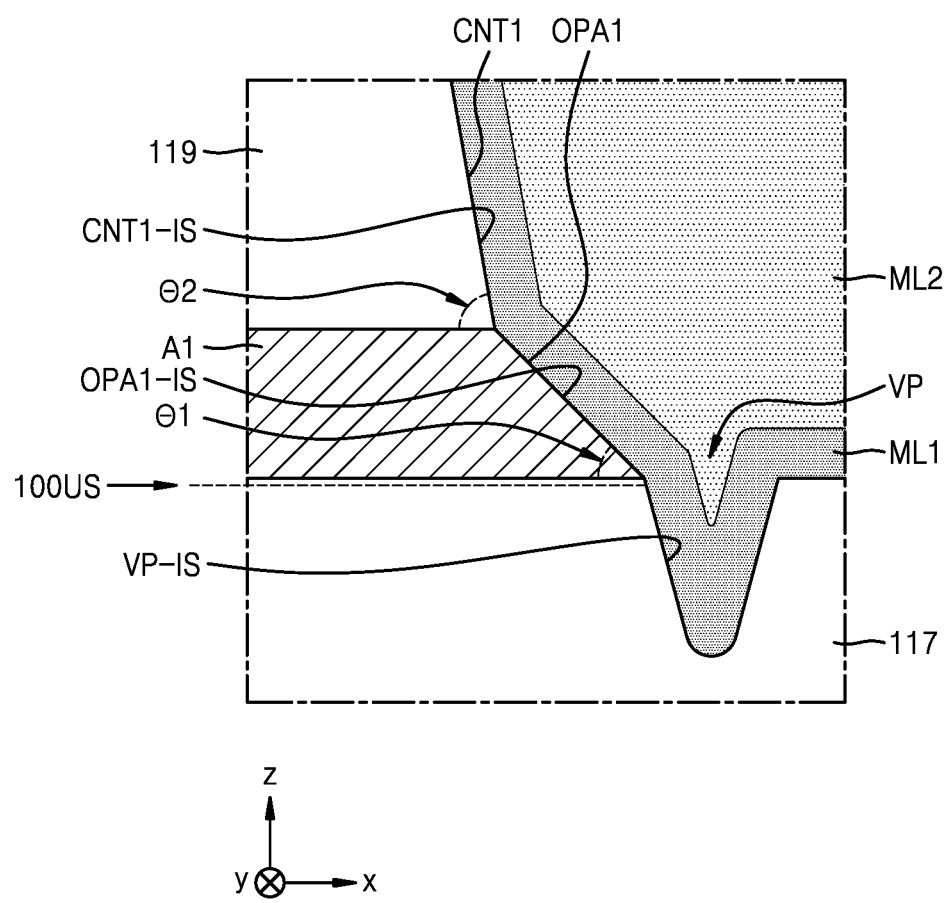
FIG. 14 is an enlarged schematic cross-sectional view of region E of FIG. 12.

FIG. 13 is a schematic cross-sectional view of a portion of a thin-film transistor according to an embodiment, and FIG. 14 is an enlarged schematic cross-sectional view of region E of FIG. 13.

Embodiments of FIGS. 13 and 14 may differ from the aforementioned embodiments in the shape of the lower portion of the opening OPA1. Because other configurations may be the same as those shown in FIGS. 3 to 5, differences will be described hereinbelow.

Referring to FIGS. 13 and 14, a valley portion VP may be provided in the first interlayer insulating layer 117 extending from the inner surface OPA1-IS of the opening OPA1. The valley portion VP may be formed by removing at least a portion of the first interlayer insulating layer 117 in a thickness direction. Unlike the aforementioned groove portion HP, the valley portion VP may be provided along a perimeter of an edge of the first interlayer insulating layer 117, the edge being exposed by the opening OPA1. There may be a structural difference between the valley portion VP and the aforementioned groove portion HP. The valley portion VP may be formed by removing a portion of the first interlayer insulating layer 117 along the perimeter of the edge of the first interlayer insulating layer 117, the edge being exposed by the opening OPA1, whereas, with regard to the groove portion HP, a thickness of the portion of the first interlayer insulating layer 117, the portion being exposed by the opening OPA1, decreases entirely.

The valley portion VP may include an inner surface VP-IS extending in direction from the inner surface OPA1-IS of the opening OPA1 to the substrate 100. When forming the opening OPA1, the valley portion VP may be intentionally (formed in the first interlayer insulating layer 117 together with the opening OPA1, which makes it easier to form the angle θ1 of the inner surface OPA1-IS of the opening OPA1 with a high slope of about 30° or greater.

The first electrode layer may be arranged on the valley portion VP. At least a portion of the first electrode layer may be buried in the valley portion VP. In an embodiment, the first metal layer ML1 may be arranged along the inner surface VP-IS of the valley portion VP. At least a portion of the second metal layer ML2 may be buried in the valley portion VP in which the first metal layer ML1 may be arranged.

Figure 15:
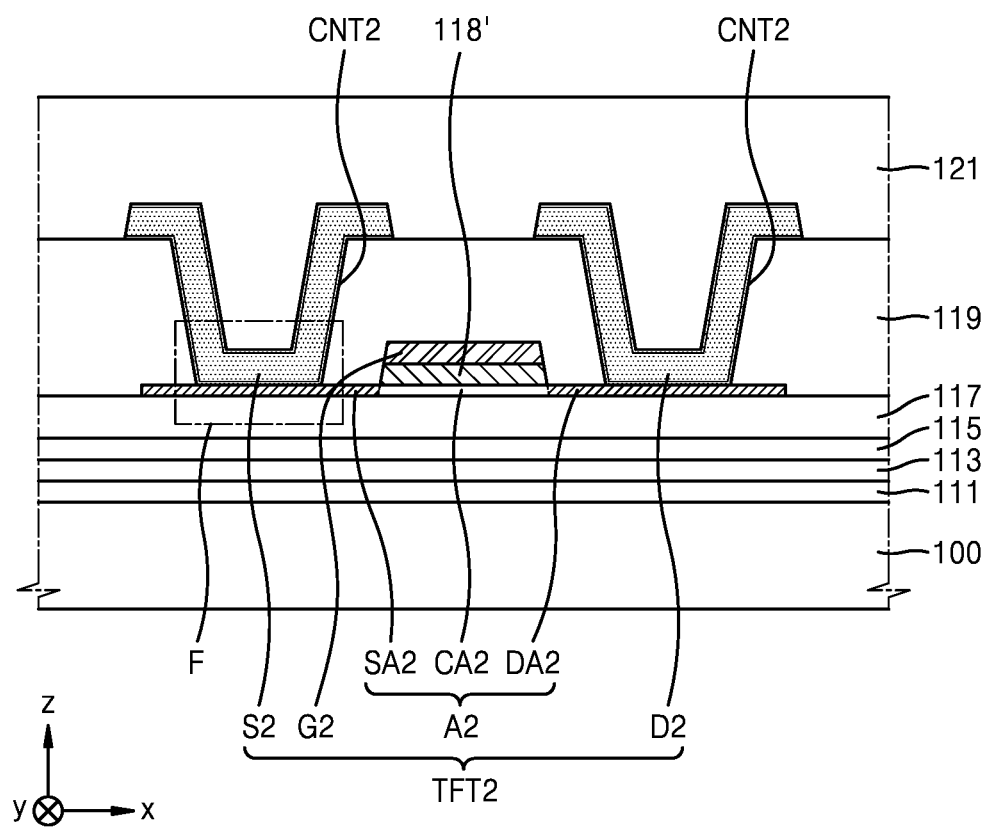
FIG. 15 is a schematic cross-sectional view of a thin-film transistor according to an embodiment.
Figure 16:
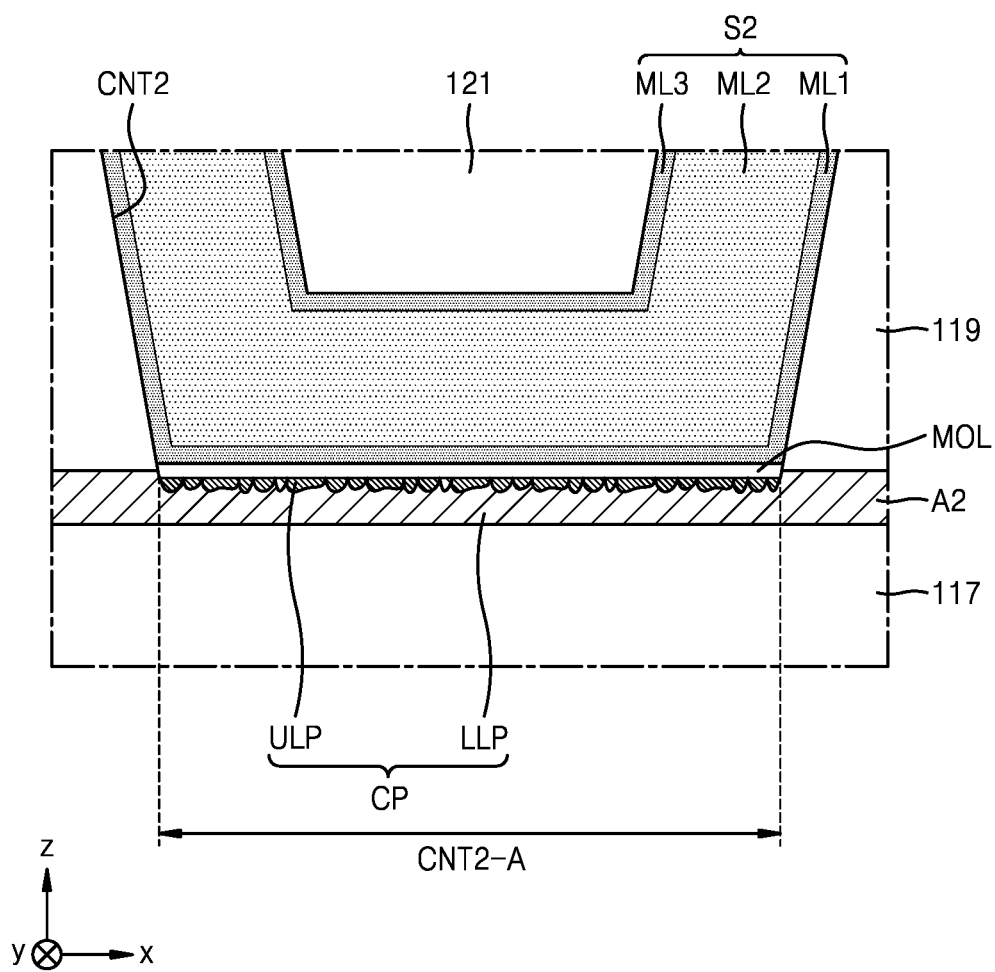
FIG. 16 is an enlarged schematic cross-sectional view of region F of FIG. 15.

FIG. 15 is a schematic cross-sectional view of a portion of a thin-film transistor according to an embodiment, and FIG. 16 is an enlarged schematic cross-sectional view of region F of FIG. 15.

Referring to FIG. 15, a second thin-film transistor TFT2 may include a second semiconductor layer A2, a second gate electrode G2 arranged to at least partially overlap the second semiconductor layer A2, and a second electrode layer electrically connected to the second semiconductor layer A2, for example, a second source electrode S2 and/or a second drain electrode D2. In the following descriptions of FIG. 15, layers denoted by the same reference numerals may refer to the same layers as in FIG. 3 described above. Therefore, redundant descriptions of the corresponding layers may be understood by referring to the aforementioned descriptions of FIG. 3.

The second semiconductor layer A2 may include an oxide semiconductor material. The second semiconductor layer A2 may include an oxide of at least one material selected from the group consisting of In, Ga, Sn, Zr, V, Hf, Cd, Ge, Cr, Ti, and Zn. For example, the second semiconductor layer A2 may be an ITZO semiconductor layer, an IGZO semiconductor layer, etc.

The second gate electrode G2 may be arranged on the second semiconductor layer A2, a third gate insulating layer 118' may be between the second semiconductor layer A2 and the second gate electrode G2. In case that the third gate insulating layer 118' may be patterned to overlap a portion of the second semiconductor layer A2, an area in which the third gate insulating layer 118' and the second semiconductor layer A2 overlap each other may be provided as a channel area CA2, and the other areas may be provided as a source area SA2 and a drain area DA2.

The second gate electrode G2 may be arranged to cover the second interlayer insulating layer 119. Second contact holes CNT2 may be formed in the second interlayer insulating layer 119 to expose at least portions of the source area SA2 and the drain area DA2. The second electrode layer arranged on the second interlayer insulating layer 119 may be electrically connected to the second semiconductor layer A2 through the second contact holes CNT2. Although it is shown in FIG. 15 that the second contact holes CNT2 that respectively expose the source area SA2 and the drain area DA2 may be formed in the second interlayer insulating layer 119, in some cases, a second contact hole CNT2 may be formed to expose one of the source area SA2 and the drain area DA2.

The second electrode layer, for example, the second source electrode S2 and the second drain electrode D2, may be arranged on the second interlayer insulating layer 119. Each of the second source electrode S2 and the second drain electrode D2 may be electrically connected to the second semiconductor layer A2 through each second contact hole CNT2 defined in the second interlayer insulating layer 119. In an embodiment, each of the second source electrode S2 and the second drain electrode D2 may include a single layer of Mo, Al, etc., or a combination thereof, or multiple layers of Mo/Al/Mo, Ti/Al/Ti, etc., or combinations thereof.

A planarization layer 121 may be arranged on the second source electrode S2 and the second drain electrode D2.

A method of forming the channel area CA2, the source area SA2, and the drain area DA2 of the second semiconductor layer A2 and a material forming the second gate electrode G2, the second source electrode S2, and the second drain electrode D2, which all have been described above, may be the same as those of the first thin-film transistor TFT1 of FIG. 3 described above.

A portion of the source area SA2 and/or the drain area DA2 of the second semiconductor layer A2, the porting being exposed through each second contact hole CNT2, may be a second contact area CNT2-A in which the second source electrode S2 and/or the second drain electrode D2 contact(s) the second semiconductor layer A2.

A contact portion CP of the second semiconductor layer A2 corresponding to the second contact area CNT2-A may include an upper layer portion ULP and a lower layer portion LLP, and the metal oxide layer MOL may be positioned on the contact portion CP. In an embodiment, the upper layer portion ULP and the lower layer portion LLP may have different film properties. In other words, the upper layer portion ULP of the contact portion CP may include a crystalline metal oxide, and the lower layer portion LLP of the contact portion CP may include an amorphous oxide semiconductor material.

The upper layer portion ULP may include, for example, a crystallized indium oxide. A film composition ratio of the indium oxide may be defined as $InO_N$ (where N may be about 0.5 to about 1.5) and may be, for example, $In_2O_3$. As shown in FIG. 16, the upper layer portion ULP may include a layer in which grains may be uniformly formed, or may include a layer formed by aggregation of particles.

In an embodiment, the upper layer portion ULP that may be crystallized may be formed together through a process of forming the second contact hole CNT2, or may be formed through a separate process. The upper layer portion ULP that may be crystallized may cause dispersion due to an increase in resistance of the second semiconductor layer A2 and deterioration in performance of the second thin-film transistor TFT2. Therefore, in terms of the performance of the second thin-film transistor TFT2, it may be important that the lower layer portion LLP which may be an amorphous oxide semiconductor layer may be provided with a predetermined thickness or more. For example, in case that a thickness of the second semiconductor layer A2 may be about 40 nm, a thickness of the lower layer portion LLP may be about 1 nm or greater, for example, about 1 nm or greater and about 30 nm or less.

The metal oxide layer MOL may be positioned on the upper layer portion ULP. In the process of forming the second contact hole CNT2, the oxide bonds on the surface of the second semiconductor layer A2 may be dissociated, and the dissociated oxide bonds may be bonded to the metal material, thereby forming the metal oxide layer MOL. The metal oxide layer MOL may also be a factor that deteriorates the performance of the second thin-film transistor TFT2 like the aforementioned upper layer portion ULP. Because the metal oxide layer MOL may be formed as a reaction when the second contact hole CNT2 may be formed, it may be important to keep the performance of the second semiconductor layer A2 constant despite the presence of the metal oxide layer MOL.

Therefore, the second thin-film transistor TFT2 according to an embodiment may have a stack structure of the lower layer portion LLP, the upper layer portion ULP, and the metal oxide layer MOL in response to the second contact area CNT2-A. The lower layer portion LLP may be provided as an amorphous oxide semiconductor layer having a thickness of about 1 nm, and thus a second thin-film transistor TFT2 having stable device characteristics with low resistance may be implemented, despite the presence of the upper layer portion ULP and the metal oxide layer MOL.

Figure 17:
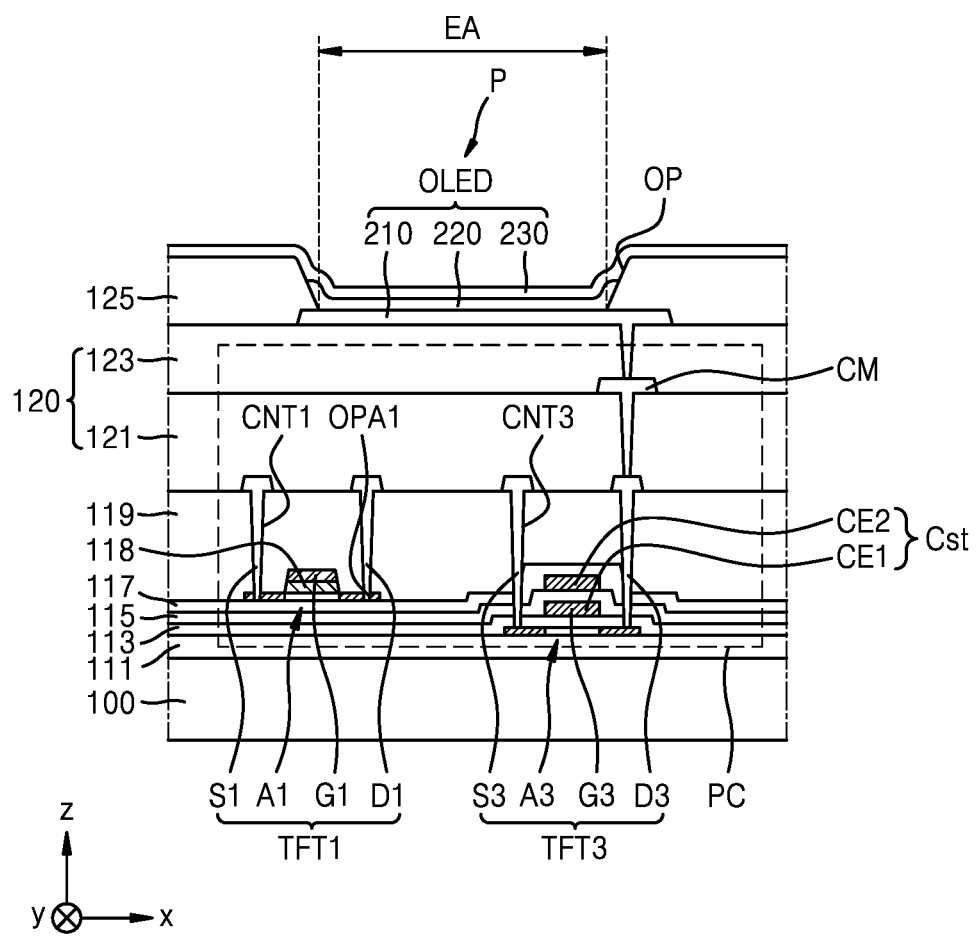
FIG. 17 is a schematic cross-sectional view of a portion of a display apparatus according to an embodiment.

FIG. 17 is a schematic cross-sectional view of a portion of a display apparatus according to an embodiment.

Referring to FIG. 17, on the substrate 100, a pixel circuit PC including the first thin-film transistor TFT1, a third thin-film transistor TFT3, and the storage capacitor Cst, and the organic light-emitting diode OLED electrically connected to the pixel circuit PC may be arranged. The first thin-film transistor TFT1 of FIG. 17 may be the first thin-film transistor TFT1 of FIGS. 3 to 14 described above. In the following descriptions of FIG. 17, layers denoted by the same reference numerals may refer to the same layers as in the above-described drawings. Accordingly, the following descriptions of FIG. 17 may be equally applied to the layers denoted by the same reference numerals shown in the above-described drawings.

The substrate 100 may include a glass material, a ceramic material, a metallic material, a flexible or bendable material, or a combination thereof. In case that the substrate 100 may be flexible or bendable, the substrate 100 may include a polymer resin, such as polyethersulfone, polyacrylate, polyetherimide, polyethylene naphthalate, polyethyelene terephthalate, polyphenylene sulfide, polyarylate, polyimide, polycarbonate, cellulose acetate propionate, or a combination thereof.

The substrate 100 may have a single-layered or multi-layered structure including the above-described material. In the case of the multi-layered structure, the substrate 100 may further include an inorganic layer. In an embodiment, the substrate 100 may have a structure of an organic material/inorganic material/organic material.

A barrier layer (not shown) may be further included between the substrate 100 and the buffer layer 111. The barrier layer may prevent or reduce penetration of impurities from the substrate 100 or the like into semiconductor layers A1 and A3. The barrier layer may include an inorganic material such as an oxide, nitride, or a combination thereof, an organic material, or an organic-inorganic composite and may have a single-layered or a multi-layered structure of an inorganic material and an organic material.

The third thin-film transistor TFT3 may include a third semiconductor layer A3, a third gate electrode G3, a third source electrode S3, and a third drain electrode D3.

The third semiconductor layer A3 of the third thin-film transistor TFT3 may be arranged on the buffer layer 111. In an embodiment, the third semiconductor layer A3 may include amorphous silicon, polysilicon, or a combination thereof. The third semiconductor layer A3 may include a channel area, and a source area and a drain area arranged on both sides of the channel area. The third semiconductor layer A3 may include a single layer or multiple layers.

The first gate insulating layer 113 and the second gate insulating layer 115 may be stacked and arranged on the substrate 100 to cover the third semiconductor layer A3. The first gate insulating layer 113 and the second gate insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), or a combination thereof.

The third gate electrode G3 of the third semiconductor layer A3 may be arranged on the first gate insulating layer 113.

In an embodiment, the storage capacitor Cst may include the first electrode CE1 and the second electrode CE2, and may overlap the third thin-film transistor TFT3 as shown in FIG. 17. For example, the third gate electrode G3 of the third thin-film transistor TFT3 may function as the first electrode CE1 of the storage capacitor Cst. In other embodiments, the storage capacitor Cst may not overlap the third thin-film transistor TFT3 and may exist separately.

The second electrode CE2 of the storage capacitor Cst may overlap the first electrode CE1 with the second gate insulating layer 115 therebetween and form a capacitance. The second gate insulating layer 115 may function as a dielectric layer of the storage capacitor Cst.

The first interlayer insulating layer 117 and the second interlayer insulating layer 119 may be provided on the second gate insulating layer 115 to cover the second electrode CE2 of the storage capacitor Cst. The first interlayer insulating layer 117 and the second interlayer insulating layer 119 may include $SiO_2$, $SiN_x$, SiON, $Al_2O_3$, $TiO_2$, $Ta_2O_5$, $HfO_2$, ZnO, or a combination thereof.

The first semiconductor layer A1 may be arranged on the first interlayer insulating layer 117. The first semiconductor layer A1 may include an oxide semiconductor material. The first semiconductor layer A1 may include, for example, an oxide of at least one material selected from the group consisting of In, Ga, Sn, Zr, V, Hf, Cd, Ge, Cr, Ti, Al, cesium (Cs), cerium (Ce), and Zn.

As an example, the first semiconductor layer A1 may be an ITZO semiconductor layer, an IGZO semiconductor layer, etc. Because an oxide semiconductor has a wide band gap (e.g., about 3.1 eV), high carrier mobility, and low leakage current, an amount of a voltage drop may not be large even in case that a driving time may be long, and thus an amount of a change in luminance due to the voltage drop may be small even during low frequency driving.

A bottom metal layer (not shown) may be arranged under the first semiconductor layer A1. The bottom metal layer may include a conductive material including Mo, Al, Cu, Ti, or the like, or a combination thereof, and may have a single-layered or multi-layered structure including the above materials. As an example, the bottom metal layer may have a multi-layered structure of Ti/Al/Ti.

In an embodiment, the bottom metal layer may be arranged to overlap the first semiconductor layer A1 including the oxide semiconductor material. Because the first semiconductor layer A1 including the oxide semiconductor material may be vulnerable to light, the bottom metal layer may prevent changes in device characteristics of the first thin-film transistor TFT1 including the oxide semiconductor material due to generation of a photocurrent in the first semiconductor layer A1 by external light incident from the substrate 100.

The third gate insulating layer 118 may be arranged on the first semiconductor layer A1. The third gate insulating layer 118 may include $SiO_2$, $SiN_x$, SiON, $Al_2O_3$, $TiO_2$, $Ta_2O_5$, $HfO_2$, $ZnO_2$, or a combination thereof.

In an embodiment, as shown in FIG. 17, the third gate insulating layer 118 may be patterned to overlap a portion of the first semiconductor layer A1.

An area in which the third gate insulating layer 118 and the first semiconductor layer A1 overlap each other may be a channel area, and the other areas may be a source area and a drain area, respectively. In another embodiment, the third gate insulating layer 118 may not be patterned to overlap a portion of the first semiconductor layer A1, and may be arranged on an entire surface of the substrate 100 to entirely cover the first semiconductor layer A1.

The first gate electrode G1 may be arranged on the third gate insulating layer 118 to at least partially overlap the first semiconductor layer A1.

Source electrodes S1 and S3 and drain electrodes D1 and D3 may be arranged on the second interlayer insulating layer 119.

The source electrodes S1 and S3 and the drain electrodes D1 and D3 may each include a conductive material including Mo, Al, Cu, Ti, or the like, or a combination thereof, and may each include a single layer or multiple layers including the above material. As an example, the source electrodes S1 and S3 and the drain electrodes D1 and D3 may each have a multi-layered structure of Ti/Al/Ti. The source electrodes S1 and S3 and the drain electrodes D1 and D3 may each be electrically connected to source areas or the drain areas of the semiconductor layers A1 and A3 through the contact holes CNT1 and CNT3.

The opening OPA1 corresponding to the first contact hole CNT1 may be provided in the first semiconductor layer A1. In particular, as described above in FIG. 3 or the like, the first source electrode S1 and the first drain electrode D1 may be arranged in the opening OPA1 and electrically connected to the first semiconductor layer A1 through an inner surface of the opening OPA1.

The source electrodes S1 and S3 and the drain electrodes D1 and D3 may be covered with an inorganic protective layer (not shown). The inorganic protective layer may include a single layer or multiple layers of $SiN_X$ and Six. The inorganic protective layer may have been introduced to cover and protect some wiring lines arranged on the second interlayer insulating layer 119.

In an embodiment, the first and third thin-film transistors TFT1 and TFT3 may be any one of the thin-film transistors T1 to T7 described above in FIG. 2.

A planarization layer 120 may be arranged on the second interlayer insulating layer 119, and an organic light-emitting diode OLED may be arranged on the planarization layer 120.

The planarization layer 120 may include a single layer or multiple layers including an organic material and may provide a flat upper surface. The planarization layer 120 may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

In an embodiment, as shown in FIG. 17, the planarization layer 120 may include multiple layers and may include a first planarization layer 121 and a second planarization layer 123. A contact metal CM is disposed on the first planarization layer 121, and the third thin-film transistor TFT3 and a pixel electrode 210 may be electrically connected via the contact metal CM.

The organic light-emitting diode OLED may be arranged on the planarization layer 120. The organic light-emitting diode OLED may include the pixel electrode 210, an intermediate layer 220 including an organic emission layer, and an opposite electrode 230.

The pixel electrode 210 may be a (semi-)transmissive electrode or a reflective electrode. In an embodiment, the pixel electrode 210 may include a reflective layer including Ag, Mg, Al, Pt, Pd, Au, Ni, Nd, Ir, Cr, or a compound thereof, and a transparent or semi-transparent electrode layer formed on the reflective layer. The transparent or semi-transparent electrode layer may include at least one selected from the group consisting of indium tin oxide (ITO), indium zinc oxide (IZO), ZnO, indium oxide ($In_2O_3$), indium gallium oxide (IGO), and aluminum zinc oxide (AZO). For example, the pixel electrode 210 may include ITO/Ag/ITO.

A pixel-defining layer 125 may be arranged on the planarization layer 120. The pixel-defining layer 125 may prevent arcs from occurring at an edge of the pixel electrode 210 by increasing a distance between the edge of the pixel electrode 210 and the opposite electrode 230 above pixel electrode 210.

The pixel-defining layer 125 may include at least one organic insulating material selected from the group consisting of polyimide, polyamide, acrylic resin, benzocyclobutene, and phenol resin and may be formed by spin coating or the like.

The intermediate layer 220 of the organic light-emitting diode OLED may be arranged in an opening OP formed by the pixel-defining layer 125. An emission area EA of the organic light-emitting diode OLED may be defined by the opening OP.

The intermediate layer 220 may include an organic emission layer. The organic emission layer may include an organic material including a fluorescent or phosphorescent material that may emit red, green, blue, or white light. The organic emission layer may include a low-molecular weight organic material or a polymer organic material. A functional layer such as a hole transport layer (HTL), a hole injection layer (HIL), an electron transport layer (ETL), or an electron injection layer (EIL) may selectively be further arranged above and below the organic emission layer.

The organic emission layer may be arranged to correspond to each pixel electrode 210 provided for each pixel P. In addition to the organic emission layer, the intermediate layer 220 may include an integrated layer over multiple pixel electrodes 210. Various modifications may be made.

The opposite electrode 230 may be a transmissive electrode or a reflective electrode. In some embodiments, the opposite electrode 230 may be a transparent or translucent electrode, and may include a metal thin-film having a small work function, including Li, Ca, lithium fluoride (LiF)/Ca, LiF/Al, Al, Ag, Mg, and a compound thereof. A transparent conductive oxide (TCO) layer such as ITO, IZO, ZnO, or $In_2O_3$ may be further arranged on the metal thin-film. The opposite electrode 230 may be formed as a single body over an entire surface of the display area DA, and may be arranged above the intermediate layer 220 and pixel-defining layer 125.

A capping layer (not shown) may be arranged above the opposite electrode 230. The capping layer may be configured to protect the opposite electrode 230 and increase light extraction efficiency. For example, the capping layer may include a material having a refractive index of about 1.2 to about 3.1. The capping layer may include an organic material. However, the capping layer may also be removed.

Although not shown, a thin-film encapsulation layer (not shown) including at least one organic encapsulation layer and at least one inorganic encapsulation layer may be further arranged above the opposite electrode 230.

Although only the first thin-film transistor TFT1 and the third thin-film transistor TFT3 are shown in FIG. 17, in another embodiment, the pixel circuit PC may include the second thin-film transistor TFT2 as shown in FIG. 15. For example, the pixel circuit PC may include the second thin-film transistor TFT2 and the third thin-film transistor TFT3, or may include all of the first thin-film transistor TFT1 to the third thin-film transistor TFT3.

Although the display apparatus has been described, the disclosure is not limited thereto. For example, methods of forming the display apparatus will also fall within the scope of the disclosure.

According to an embodiment having the above configuration, the display apparatus including a circuit with improved characteristics and including a thin-film transistor may be implemented. However, the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims including equivalents thereof.

What is claimed is:

1. A display apparatus comprising:
a first interlayer insulating layer arranged on a substrate;
a first semiconductor layer having a first upper surface and a first lower surface spaced apart from the first upper surface in a thickness direction, the first lower surface arranged on an upper surface of the first interlayer insulating layer, the first semiconductor layer including an oxide semiconductor material;
a first gate electrode arranged on the first upper surface of the first semiconductor layer;
a second interlayer insulating layer arranged on the first gate electrode and having a lower surface directly contacting the first upper surface of the first semiconductor layer;
a third semiconductor layer arranged between the substrate and the first interlayer insulating layer;
a first electrode layer arranged on the second interlayer insulating layer and electrically connected to the first semiconductor layer through a first contact hole penetrating the second interlayer insulating layer; and
a third electrode layer arranged on the second interlayer insulating layer and electrically connected to the third semiconductor layer through a third contact hole penetrating the second interlayer insulating layer and the first interlayer insulating layer, wherein
the first semiconductor layer includes an opening corresponding to the first contact hole,
the first electrode layer contacts an inner surface of the opening of the first semiconductor layer, and
an angle between an upper surface of the substrate and the inner surface of the opening of the first semiconductor layer is 30° to 80°,
the first electrode layer has an upper surface and a bottom surface opposite each other;
the first interlayer insulating layer has a top surface and a bottom surface opposite each other;
the top surface of the first interlayer insulating layer is exposed through the opening of the first semiconductor layer; and
the bottom surface of the first electrode layer directly contacts the top surface of the first interlayer insulating layer.

2. The display apparatus of claim 1, wherein the oxide semiconductor material is an amorphous oxide semiconductor material.

3. The display apparatus of claim 1, wherein the first electrode layer contacts at least a portion of the first interlayer insulating layer, the portion being exposed through the opening.

4. The display apparatus of claim 3, wherein the first interlayer insulating layer includes a groove corresponding to the opening.

5. The display apparatus of claim 4, wherein a slope of an inner surface of the first contact hole and a slope of an inner surface of the groove are steeper than a slope of the inner surface of the opening.

6. The display apparatus of claim 1, wherein a slope of an inner surface of the first contact hole is steeper than a slope of the inner surface of the opening.

7. The display apparatus of claim 1, wherein the inner surface of the opening includes at least two surfaces having different angles.

8. The display apparatus of claim 7, wherein
the inner surface of the opening includes a first surface and a second surface having different angles,
the first surface has a surface area greater than a surface area of the second surface, and
an angle between the first surface and an upper surface of the substrate is about 30° or greater.

9. The display apparatus of claim 8, further comprising a metal oxide layer disposed on at least a portion between the second surface of the inner surface of the opening and the first electrode layer.

10. The display apparatus of claim 9, wherein
the first semiconductor layer includes a portion that contacts the metal oxide layer, and
the portion of the first semiconductor layer includes:
an upper layer portion including a crystalline metal oxide; and
a lower layer portion including an amorphous oxide semiconductor material.

11. The display apparatus of claim 9, wherein
the first electrode layer includes:
a first metal layer and a third metal layer which include a same material; and
a second metal layer between the first metal layer and the third metal layer,
the second metal layer including a different material from a material of the first metal layer and a material of the third metal layer, wherein a thickness of the first metal layer and a thickness of the third metal layer are less than a thickness of the second metal layer, and
a thickness of metal oxide layer is less than the thickness of the first metal layer and the thickness of the third metal layer.

12. The display apparatus of claim 8, wherein
the first surface is extended to an inner surface of the first contact hole, and
an angle formed by the second surface is less than an angle formed by the first surface.

13. The display apparatus of claim 12, wherein an angle between the second surface and the upper surface of the substrate is about 30° or less.

14. The display apparatus of claim 1, further comprising a valley portion disposed at an edge portion of the first interlayer insulating layer, wherein
the valley portion is recessed in a direction of the substrate, and
the edge portion of the first interlayer insulating layer is exposed by the opening.

15. The display apparatus of claim 14, wherein a slope of an inner surface of the valley portion extending from the inner surface of the opening is steeper than a slope of the inner surface of the opening.

16. The display apparatus of claim 14, wherein
the first electrode layer includes:
a first metal layer and a second metal layer which include a same material; and
a third metal layer between the first metal layer and the second metal layer,
the third metal layer including a different material from a material of the first metal layer and a material of the second metal layer, and
the first metal layer is arranged along an inner surface of the valley portion.

17. The display apparatus of claim 16, wherein at least a portion of the second metal layer is disposed in the valley portion.

18. The display apparatus of claim 1, further comprising:
a second semiconductor layer arranged on the first interlayer insulating layer and including an oxide semiconductor material;
a second gate electrode arranged on the second semiconductor layer; and
a second electrode layer arranged on the second interlayer insulating layer and electrically connected to a contact portion of the second semiconductor layer through a second contact hole penetrating the second interlayer insulating layer,
wherein the contact portion of the second semiconductor layer includes:
an upper layer portion including a crystalline metal oxide; and
a lower layer portion including an amorphous oxide semiconductor material.

19. The display apparatus of claim 18, further comprising a metal oxide layer between the contact portion of the second semiconductor layer and the second electrode layer.

20. The display apparatus of claim 1, wherein the first gate electrode is spaced part from the first interlayer insulating layer by the first semiconductor layer disposed therebetween.

21. The display apparatus of claim 1, wherein
the second interlayer insulating layer directly contacts the first gate electrode.

22. The display apparatus of claim 21, wherein
the first gate electrode has a second lower surface and a second upper surface spaced apart from the second lower surface in the thickness direction, the second interlayer insulating layer directly contacting the second upper surface of the first gate electrode.

* * * * *